US009025706B2

(12) United States Patent
Kitamura

(10) Patent No.: US 9,025,706 B2
(45) Date of Patent: May 5, 2015

(54) RECEIVER WITH ADAPTIVE FILTER AND GAIN CONTROL

(75) Inventor: Ryo Kitamura, Kuala Lumpur (MY)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/131,845

(22) PCT Filed: Sep. 12, 2012

(86) PCT No.: PCT/JP2012/005800
§ 371 (c)(1),
(2), (4) Date: Jan. 9, 2014

(87) PCT Pub. No.: WO2013/046574
PCT Pub. Date: Apr. 4, 2013

(65) Prior Publication Data
US 2014/0146926 A1    May 29, 2014

(30) Foreign Application Priority Data

Sep. 26, 2011  (JP) ................. 2011-209655

(51) Int. Cl.
*H03G 3/20*  (2006.01)
*H04L 25/06*  (2006.01)
*H04L 1/00*  (2006.01)
(Continued)

(52) U.S. Cl.
CPC ............ *H04L 25/061* (2013.01); *H04L 1/0036* (2013.01); *H03F 3/45475* (2013.01); *H03F 3/45968* (2013.01); *H03G 3/3052* (2013.01); *H03F 2200/168* (2013.01); *H03F 2200/408* (2013.01); *H03F 2203/45138* (2013.01); *H04B 1/0007* (2013.01); *H04B 1/28* (2013.01)

(58) Field of Classification Search
CPC ... H04L 25/066; H04L 25/061; H04L 1/0036; H03F 2200/168; H03F 3/45475; H03F 3/45968; H03D 3/008; H03G 3/20; H03G 3/3052
USPC ......... 375/345, 316; 455/253.2, 234.1, 232.1, 455/230, 130, 251.1, 231, 266; 327/306, 327/307, 100
See application file for complete search history.

(56) References Cited

U.S. PATENT DOCUMENTS 5,471,665 A * 11/1995 Pace et al. .................. 455/343.2
6,504,799 B1 * 1/2003 Yamashita et al. ......... 369/44.11
(Continued)

FOREIGN PATENT DOCUMENTS

CN   1435951 A   8/2003
CN   1612554 A   5/2005
(Continued)

OTHER PUBLICATIONS

International Search Report for Application No. PCT/JP2012/005800 dated Oct. 30, 2012.

*Primary Examiner* — Chieh M Fan
*Assistant Examiner* — Michelle M Koeth
(74) *Attorney, Agent, or Firm* — Pearne & Gordon LLP

(57) ABSTRACT

VGAs amplify a baseband reception signal using a prescribed gain. HPFs stop part, in a band lower than a first cutoff frequency, of the amplified reception signal. An ADC AD-converts an output signal of the HPFs and thereby outputs a digital reception signal. An AGC controller outputs a gain code corresponding to a prescribed gain of the VGAs. A VGA gain corrector adjusts the gain of the VGAs by a prescribed amount.

9 Claims, 19 Drawing Sheets

(51) Int. Cl.
  *H03F 3/45* (2006.01)
  *H03G 3/30* (2006.01)
  *H03F 1/02* (2006.01)
  *H04B 1/00* (2006.01)
  *H04B 1/28* (2006.01)

(56) References Cited

U.S. PATENT DOCUMENTS

| | | | |
|---|---|---|---|
| 7,551,907 B2 * | 6/2009 | French et al. | 455/234.1 |
| 2003/0142767 A1 | 7/2003 | Ichihara | |
| 2004/0097212 A1 * | 5/2004 | Matsumoto et al. | 455/296 |
| 2004/0176055 A1 | 9/2004 | Vepsalainen et al. | |
| 2005/0093608 A1 | 5/2005 | Ohtani et al. | |
| 2006/0088001 A1 * | 4/2006 | Reitmann et al. | 370/328 |
| 2007/0066260 A1 | 3/2007 | Vepsalainen et al. | |
| 2009/0258626 A1 | 10/2009 | Yamada et al. | |

FOREIGN PATENT DOCUMENTS

| | | |
|---|---|---|
| CN | 1742441 A | 3/2006 |
| JP | 10-247953 A | 9/1998 |
| JP | 2003-224488 A | 8/2003 |
| JP | 2003-224489 A | 8/2003 |
| JP | 2005-136586 A | 5/2005 |
| JP | 2006-253816 A | 9/2006 |
| JP | 2009-253814 A | 10/2009 |

* cited by examiner

FIG. 7

| $D_{VGA\_comp}$ | $D_{VGA1}$ | $D_{VGA2}$ |
|---|---|---|
| 0 | 0 | 0 |
| 1 | 1 | 0 |
| 2 | 1 | 1 |
| 3 | 2 | 1 |
| 4 | 2 | 2 |
| ⋮ | ⋮ | ⋮ |

RECEIVER WITH ADAPTIVE FILTER AND GAIN CONTROL

TECHNICAL FIELD

The present disclosure relates to a reception circuit and a receiver which receive a signal that is transmitted in a wireless communication.

BACKGROUND ART

Direct conversion receivers can make receivers smaller, lighter, and lower in power consumption than superheterodyne ones. With these advantages, it is of great merit to use direct conversion receivers as receivers that handle millimeter wave high-frequency signals as in cellular receivers and receivers that are compatible with the IEEE (Institute of Electrical and Electronics Engineers) 802.11a/b/g standards.

In direct conversion receivers, a DC offset that is specific to the receiver circuit configuration occurs when a high-frequency reception signal is down-converted into a baseband one. In contrast, for example, in the direct conversion receiver that is disclosed in Patent document 1, a highpass filter is inserted between a variable gain amplifier and an A/D converter and a DC offset is eliminated by a capacitor that is part of the highpass filter. However, the insertion of the highpass filter in the signal path increases the AGC (automatic gain control) convergence time in the receiver.

PRIOR ART DOCUMENTS

Patent Documents

Patent document 1: JP-A-10-247953

SUMMARY OF THE INVENTION

Problems to be Solved by the Invention

The present inventor has studied reception circuits and receivers for reducing the DC offset. However, it has been difficult to obtain a reception circuit and receiver capable of reducing the DC offset sufficiently in the case where a high-frequency signal (e.g., millimeter wave signal) is used in conventional reception circuits and receivers.

The present disclosure has been made in the above circumstances in the art, and an object of the disclosure is to provide a reception circuit and a receiver which prevent increase of the error rate of a reception signal in an AGC period and a signal reception period by correcting the gain of a VGA by an amount corresponding to its gain reduction amount that occurs because of setting of a cutoff frequency of an HPF in the AGC period.

Means for Solving the Problems

This disclosure provides a reception circuit comprising: a mixer configured to frequency-convert a high-frequency reception signal and output a baseband reception signal; at least one VGA configured to amplify the baseband reception signal using a prescribed gain; at least one HPF configured to stop part, in a band that is lower than a first cutoff frequency, of the amplified reception signal; an ADC configured to AD-convert an output signal of the HPF and output a digital reception signal; a processor configured to demodulate the output signal of the ADC; an AGC controller configured to output, in an AGC period, a gain code corresponding to the prescribed gain to be set in the VGA; and a VGA gain corrector configured to correct the prescribed gain by a prescribed amount, wherein the AGC controller sets a cutoff frequency of the HPF to a second cutoff frequency that is higher than the first cutoff frequency at a start of the AGC period, and sets the cutoff frequency of the HPF to the first cutoff frequency before an end of the AGC period; and wherein the VGA gain corrector sets a correction amount of the gain to a first correction amount after the setting of the cutoff frequency of the HPF to the second cutoff frequency, and sets the correction amount of the gain to a second correction amount that is smaller than the first correction amount after the setting of the cutoff frequency of the HPF to the first cutoff frequency.

The disclosure also provides a receiver of the above kind comprising the above reception circuit; a reception antenna configured to receive the high-frequency reception signal; and a local signal generator configured to generate a local signal in a prescribed frequency band and output the local signal to the mixer.

Advantageous Effects of the Invention

The disclosure makes it possible to prevent increase of the error rate of a reception signal in an AGC period and a signal reception period by correcting the gain of a VGA by an amount corresponding to its gain reduction 27: amount that occurs because of setting of a cutoff frequency of an HPF in the AGC period.

BRIEF DESCRIPTION OF THE DRAWINGS

FIG. 7 shows the structure of an example lookup table.

MODE FOR CARRYING OUT THE INVENTION (Circumstances Leading to Embodiments)

Figure 17:
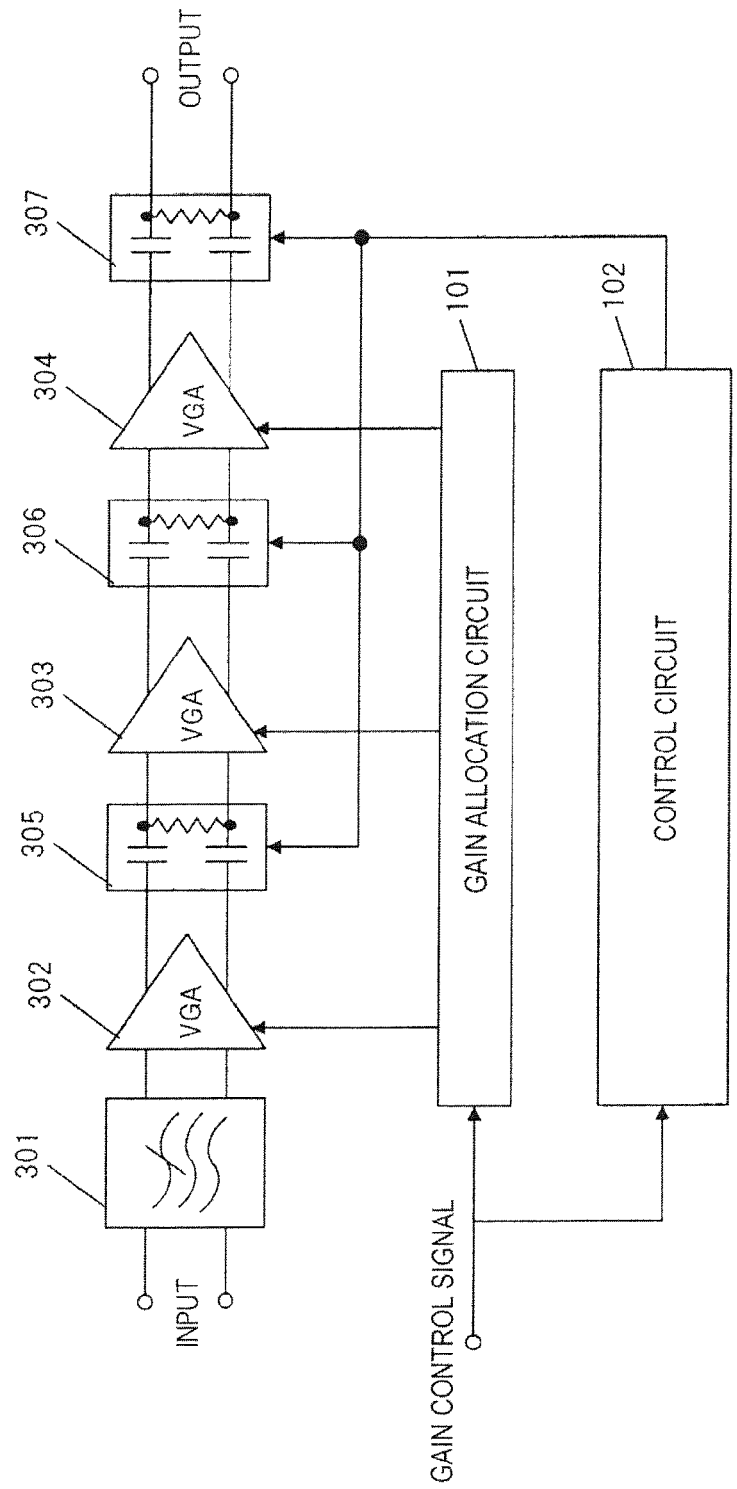
FIG. 17 shows the configuration of a baseband circuit of a conventional direct conversion receiver.

In connection with the receiver disclosed in Patent document 1, the following Referential patent document 1, for example, discloses a baseband circuit of a receiver. The baseband circuit of a receiver disclosed in Referential patent document 1 will be described with reference to FIG. 17. FIG. 17 shows the configuration of the baseband circuit of the conventional direct conversion receiver.

(Referential Patent Document 1) Japanese Patent No. 3,622,728

In the baseband circuit of a receiver shown in FIG. 17, a reception signal as converted into a baseband signal is output via a lowpass filter 301, a VGA (variable gain amplifier) 302, a highpass filter 305, a VGA 303, a highpass filter 306, a VGA 304, and a highpass filter 307.

A gain allocation circuit 101 varies the gain of the entire baseband circuit of the receiver according to the variation amount of a gain control signal and allocates the entire gain to the VGAs 302, 303, and 304. A control circuit 102 varies the cutoff frequencies of the highpass filters 305, 306, and 307. For example, if the variation amount of the AGC gain control signal is larger than a prescribed value, the control circuit 102 switches the cutoff frequencies of the respective highpass filters to ones that are higher than prescribed cutoff frequencies. As a result, the AGC convergence time can be reduced in the baseband circuit of the receiver.

(Problems to be Solved by Embodiments)

For example, in millimeter wave communication which handles wideband, high-frequency signals, the AGC convergence time should be set short because the preamble period is as short as about 1.2 µs, for example, and the time that can be consumed by AGC is about 600 ns. It is known that to set the AGC convergence time to about 600 ns it is necessary to set the cutoff frequency of a highpass filter (hereinafter abbreviated as HPF) to several hundreds of megahertz.

Figure 18:
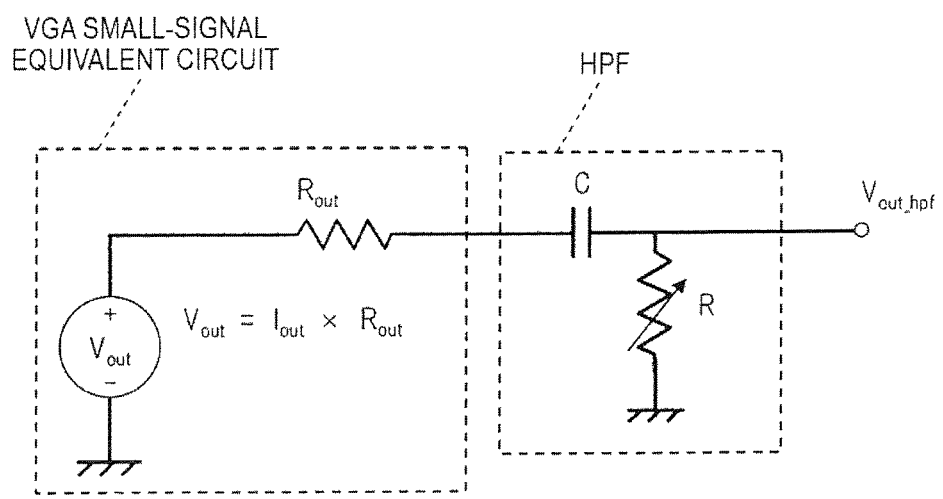
FIG. 18 is a circuit diagram showing a VGA small-signal equivalent circuit and an HPF.

In the HPF configuration using a variable resistor (resistance: R) and a capacitor (capacitance: C) (see FIG. 18), the cutoff frequency $f_c$ is given by Equation (1) and the resistance R of the variable resistor may be made down to several kiloohms. FIG. 18 is a circuit diagram showing a VGA small-signal equivalent circuit and an HPF.

[Formula 1]

$$f_c = \frac{1}{2\pi RC} \quad (1)$$

In the VGA small-signal equivalent circuit using a voltage source and an output impedance (output resistor) $R_{out}$ (see FIG. 18), an output voltage $V_{out\_hpf}$ of the HPF which is a series-connected to the VGA is given by Equation (2). In Equation (2), parameter $R_{out}$ represents the output impedance of the VGA, parameter $\omega$ represents the angular frequency, and parameter $V_{out}$ represents the output voltage of the VGA in a state that its output terminal has no connection element.

[Formula 2]

$$V_{out\_hpf} = \frac{R}{R_{out} + \frac{1}{j\omega C} + R} \cdot V_{out} \quad (2)$$

$$= \frac{R + R_{out}}{(R + R_{out}) + \frac{1}{j\omega C}} \cdot \frac{R}{R + R_{out}} \cdot V_{out}$$

As seen from Equation (2), the output voltage $V_{out\_hpf}$ of the HPF decreases as the resistance of the HPF (i.e., the resistance R of the variable resistor) becomes smaller. That is, the output voltage $V_{out\_hpf}$ of the HPF decreases as the cutoff frequency $f_c$ of the HPF becomes higher. And the low-frequency signal elimination amount increases as the cutoff frequency $f_c$ of the HPF becomes higher.

Therefore, when a millimeter wave high-frequency signal is handled by the above-described receiver disclosed in Patent document 1 or 2, during an AGC period the VGA gain decreases if the cutoff frequency $f_c$ of the HPF is increased to shorten the AGC convergence time.

Figure 19:
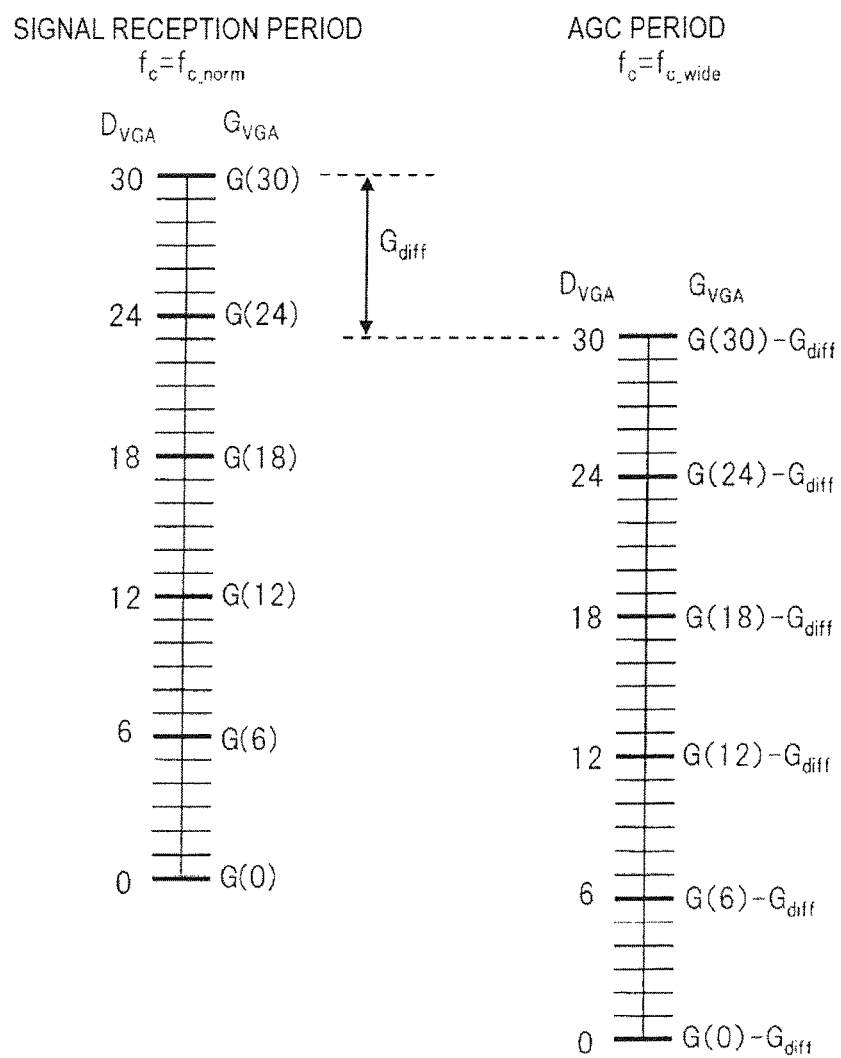
FIG. 19 illustrates a phenomenon that the VGA gain decreases by $G_{diff}$ when the cutoff frequency $f_c$ is set higher.

A more specific description will be made with reference to FIG. 19. FIG. 19 illustrates the phenomenon that the VGA gain decreases by $G_{diff}$ when the cutoff frequency $f_c$ is set higher.

The scale in the left part of FIG. 19 shows a corresponding relationship between a digital gain code (hereinafter referred to as a gain code) $D_{VGA}$ which is a VGA control variable and a gain $G_{VGA}$ which corresponds to the gain code $D_{VGA}$ in a signal reception period. The cutoff frequency $f_c$ is set equal to a prescribed first cutoff frequency $f_{c\_norm}$.

The scale in the right part of FIG. 19 shows a corresponding relationship between the digital gain code $D_{VGA}$ and the gain $G_{VGA}$ which corresponds to the gain code $D_{VGA}$ in an AGC period. The cutoff frequency $f_c$ is set equal to a second cutoff frequency $f_{c\_wide}$ which is higher than the first cutoff frequency $f_{c\_norm}$. In the following description, the first cutoff frequency $f_c$ is a normal value that is set in AGC.

At the first cutoff frequency $f_{c\_norm}$, the VGA $G_{VGA}$ becomes equal to a gain $G_{VGA}(D_{VGA})$ corresponding to a digital value of an input gain code $D_{VGA}$. For example, when a gain code $D_{VGA}=30$ is input to the VGA, a gain $G(30)$ corresponding to the gain code $D_{VGA}=30$ is set in the VGA.

However, at the second cutoff frequency $f_{c\_wide}$, the VGA $G_{VGA}$ becomes equal to a gain $\{G_{VGA}(D_{VGA}) - G_{diff}\}$, that is, a gain $G_{VGA}(D_{VGA})$ corresponding to a digital value of an input gain code $D_{VGA}$ minus a prescribed gain error $G_{diff}$. The gain error $G_{diff}$ lowers the accuracy of AGC gain adjustment, rendering it difficult to shorten the AGC convergence time.

(Reason why the VGA Gain Decreases by $G_{Diff}$ when the Cutoff Frequency $f_c$ is Increased)

Next, before the description of reception circuits and receivers according to embodiments of the disclosure, the phenomenon that the VGA gain decreases by $G_{diff}$ when the cutoff frequency $f_c$ is increased will be described in a more specific manner with reference to FIGS. 1 and 2.

Figure 1:
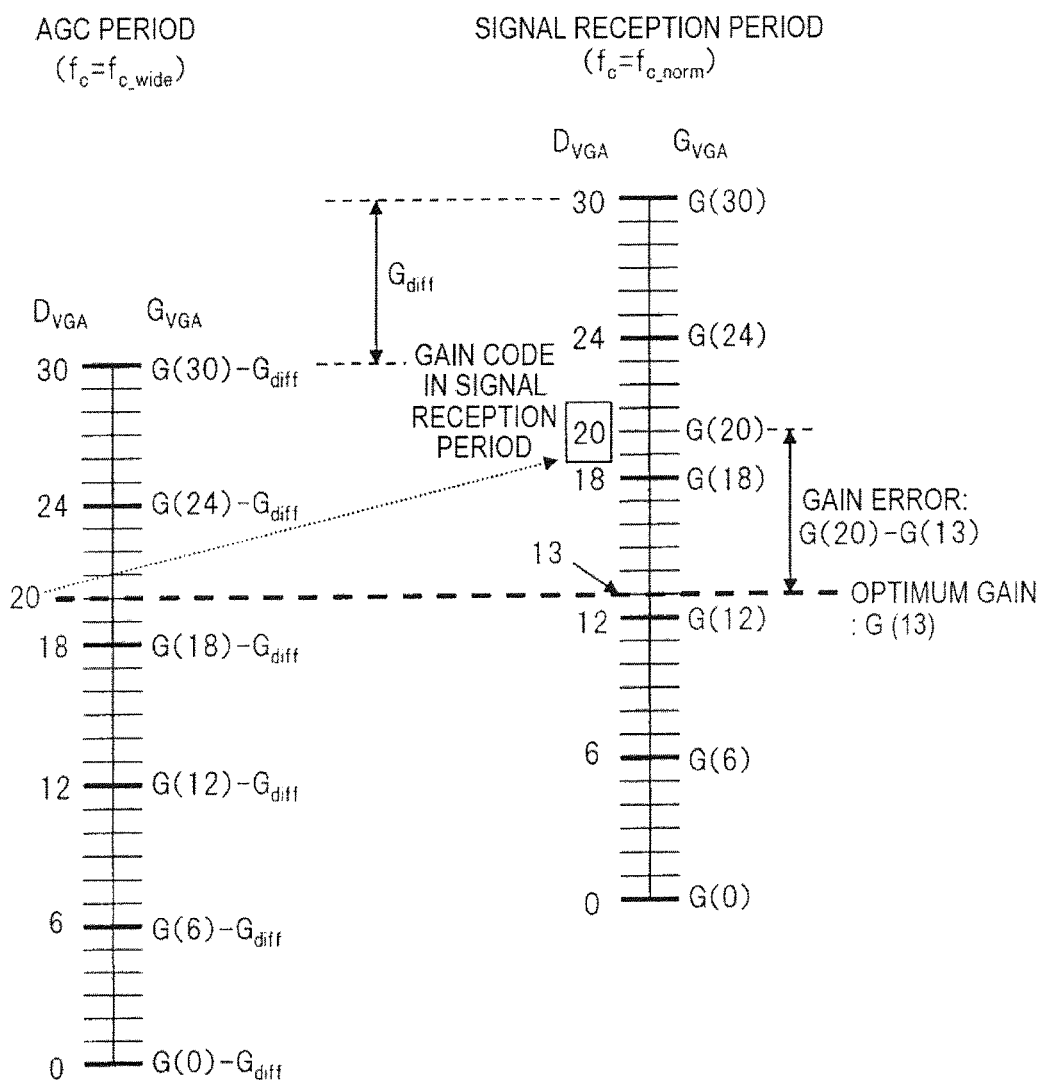
FIG. 1 illustrates a specific example of a VGA gain decrease in an AGC period.

FIG. 1 illustrates a specific example of a VGA gain decrease in an AGC period. The VGA gain decreases because of re-setting of the cutoff frequency $f_c$ from: the first cutoff frequency $f_{c\_norm}$, to a second cutoff frequency $f_{c\_wide}$.

Figure 2:
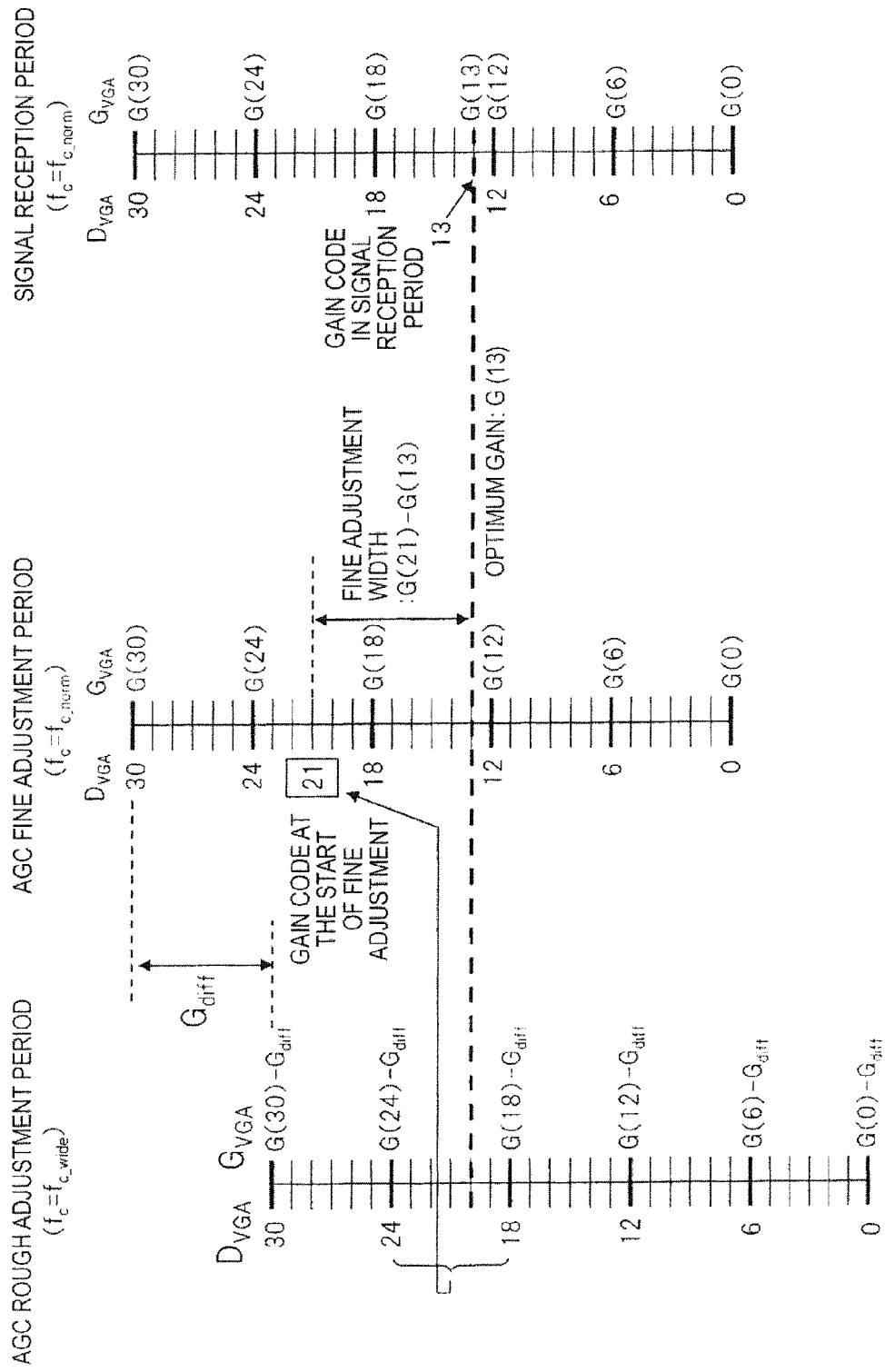
FIG. 2 illustrates a specific example of a VGA gain decrease in an AGC rough adjustment period and an AGC fine adjustment period.

FIG. 2 illustrates a specific example of a VGA gain decrease in an AGC rough adjustment period and an AGC fine adjustment period. The VGA gain decreases because of resetting of the cutoff frequency fc from the first cutoff frequency fc_norm to a second cutoff frequency fc_wide. Therefore, the convergence of the VGA gain becomes slower in the AGC fine adjustment period.

In the following description, it is assumed that the second cutoff frequency $f_{c\_wide}$ is higher than the first cutoff frequency $f_{c\_norm}$.

In the description that will be made with reference to FIGS. 1 and 2, it is assumed that the optimum VGA gain is G(13) in an AGC period of a preamble period and a signal reception period after the preamble period.

The scale in the left part of FIG. 1 corresponds to an AGC period. The cutoff frequency $f_c$ is set to a second cutoff frequency $f_{c\_wide}$, and the scale shows a corresponding relationship between the gain code $D_{VGA}$ and the gain $G_{VGA}$ which corresponds to the gain code $D_{VGA}$.

The scale in the right part of FIG. 1 corresponds to a signal reception period. The cutoff frequency $f_c$ is set to the first cutoff frequency $f_{c\_norm}$, and the scale shows a corresponding relationship between the gain code $D_{VGA}$ and the gain $G_{VGA}$ which corresponds to the gain code $D_{VGA}$.

As shown in FIG. 1, the VGA gain $G_{VGA}$ decreases by $G_{diff}$ as a whole as a result of re-setting of the HPF cutoff frequency $f_c$ from the first cutoff frequency $f_{c\_norm}$ to a second cutoff frequency $f_{c\_wide}$ in an AGC period of a preamble period. That is Equation (3) holds.

Because of the decrease $G_{diff}$, the gain code $D_{VGA}$ that specifies a VGA optimum gain in the AGC period is judged to be $D_{VGA}=20$ rather than the value corresponding to the desired optimum gain G(13). In the following description, parameter $G_{diff}$ represents a gain reduction amount.

In Equation (3), parameter $G_{VGA}$ represents a VGA gain that is obtained when the HPF cutoff frequency $f_c$ is re-set from the first cutoff frequency $f_{c\_norm}$ to the second cutoff frequency $f_{c\_wide}$ in the AGC period.

[Formula 3]

$$G_{VGA}=G(D_{VGA})-G_{diff} \quad (3)$$

Subsequently, in a signal reception period after the preamble period, the HPF cutoff frequency $f_c$ is re-set from the second cutoff frequency $f_{c\_wide}$ to the first cutoff frequency $f_{c\_norm}$. Since the gain G(20) corresponding to the gain code $D_{VGA}=20$ of the judgment that was made in the AGC period is used as a VGA gain in the signal reception period, a gain error $G_{diff}(=G(20)-G(13))$ from the desired VGA optimum gain G(13) occurs. Because of this gain error, the error rate of a reception signal increases in the signal reception period.

Next, a case that an AGC period of a preamble period is divided into a rough adjustment period and a fine adjustment period will be described with reference to FIG. 2.

First, as in the case of FIG. 1, the VGA gain $G_{VGA}$ decreases by $G_{diff}$ as a whole as a result of re-setting of the HPF cutoff frequency $f_c$ from the first cutoff frequency $f_{c\_norm}$ to a second cutoff frequency in an AGC rough adjustment period.

Because of the decrease $G_{diff}$, it is judged that the gain code $D_{VGA}$ that specifies a VGA optimum gain in the AGC rough adjustment period converges in a range of $D_{VGA}=18$ to 24 rather than the value corresponding to the desired optimum gain G(13) as a result of an AGC rough adjustment.

The description will be made with an assumption that the convergence range of the gain code $D_{VGA}$ is a six-code range in an AGC rough adjustment and is a one-code range in an AGC fine adjustment.

Subsequently, in an AGC fine adjustment period of the preamble period, the HPF cutoff frequency $f_c$ is re-set from the second cutoff frequency $f_c$ to the first cutoff frequency $f_{c\_norm}$.

In the AGC fine adjustment period, a gain G(21) corresponding to the median ($D_{VGA}=21$) of the gain codes ($D_{VGA}=18$ to 24) as judgment results obtained in the AGC rough adjustment is used as a VGA gain in the AGC fine adjustment period. Therefore, in the AGC fine adjustment period, fine adjustment is made within ±3 codes of the median gain code ($D_{VGA}=21$).

However, in the AGC fine adjustment period, since the gain error $G_{diff}(G(20)-G(13))$ from the actual VGA optimum gain G(13) has occurred as a result of the AGC rough adjustment, the AGC fine adjustment width (in the example of FIG. 2, ±3 codes) is increased by the gain error $G_{diff}$.

As a result, the AGC convergence time is elongated as a whole and a signal level adjustment takes long time in a signal reception period.

DESCRIPTION OF EMBODIMENTS

Reception circuits and receivers according to embodiments of the disclosure will be hereinafter described with reference to the drawings. In the following description, to simplify the description, it is assumed that the optimum VGA gain is an example value of G(13) in an AGC period of a preamble period and a signal reception period after the preamble period.

The gain G(13) may be an addition value of optimum gains of respective VGAs of the reception circuit/receiver in an AGC period and a signal reception period.

Embodiment 1

Figure 3:
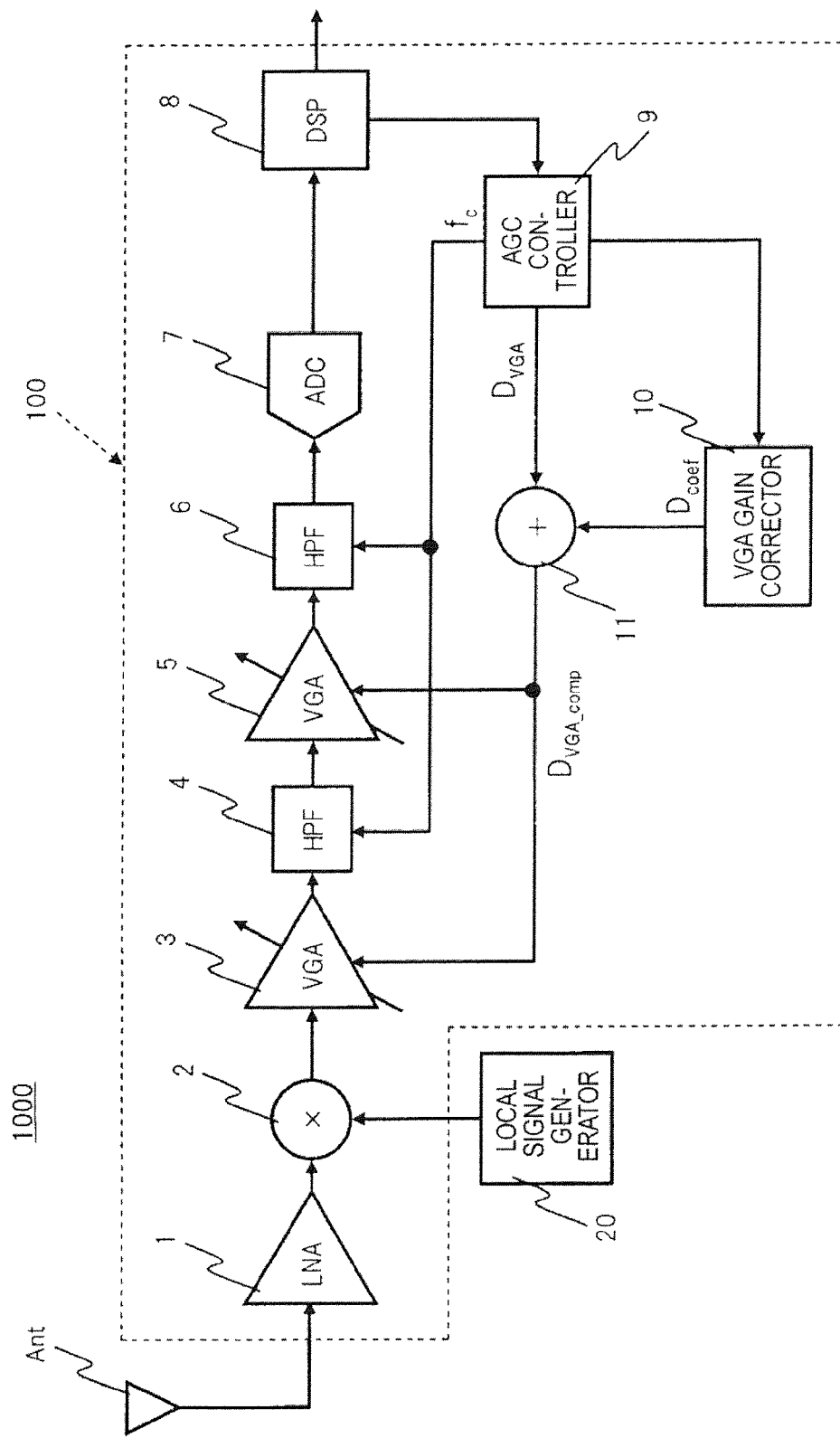
FIG. 3 is a block diagram showing the circuit configuration of a reception circuit and a receiver according to a first embodiment.

FIG. 3 is a block diagram showing the circuit configuration of a reception circuit 100 and a receiver 1000 according to a first embodiment. The receiver 1000 shown in FIG. 3 is configured so as to include a reception antenna Ant, a local signal generator 20, and the reception circuit 100. The reception circuit 100 shown in FIG. 3 is configured so as to include an LNA (low noise amplifier) 1, a mixer 2, a VGA 3, an HPF 4, a VGA 5, an HPF 6, an ADC (analog-to-digital converter) 7, a DSP (digital signal processor) 8, an AGC controller 9, a VGA gain corrector 10, and an adder 11.

The reception antenna Ant receives a millimeter wave high-frequency signal, for example, and outputs it to the LNA 1. The reception antenna Ant may be formed by using antenna elements.

The local signal generator 20 generates a local signal for down conversion to be performed in the mixer 2, and supplies it to the mixer 2.

The LNA 1 amplifies the reception signal that is output from the reception antenna Ant, and outputs the resulting signal to the mixer 2.

The mixer 2 generates a baseband reception signal by performing down conversion (frequency conversion) using the high-frequency reception signal that is output from the LNA 1 and the local signal supplied from the local signal generator 20. The mixer 2 outputs the baseband reception signal to the VGA 3.

The VGA 3 sets its gain on the basis of a gain code $D_{VGA\_comp}$ that is output from the adder 11, and amplifies or attenuates the level of the reception signal that is output from the mixer 2, using the thus-set gain. The VGA 3 outputs the level-amplified or attenuated reception signal to the HPF 4.

The HPF 4 sets its cutoff frequency $f_c$ on the basis of a cutoff frequency code $f_{cc}$ that is output from the AGC controller 9, and receives the reception signal that is output from the VGA 3. The HPF 4 sets the cutoff frequency $f_c$ on the basis of the cutoff frequency code $f_c$ that is output from the AGC controller 9, and stops part, in a band lower than the thus-set cutoff frequency $f_c$, of the received reception signal. The HPF 4 passes the other part, in a band higher than or equal to the thus-set cutoff frequency $f_c$, of the reception signal, and outputs it to the VGA 5.

The VGA 5 sets its gain on the basis of the gain code $D_{VGA\_comp}$ that is output from the adder 11, and amplifies or attenuates the level of the reception signal that is output from the HPF 4, using the thus-set gain. The VGA 5 outputs the level-amplified or attenuated reception signal to the HPF 6.

The HPF 6 sets its cutoff frequency $f_c$ on the basis of the cutoff frequency code $f_{cc}$ that is output from the AGC controller 9, and receives the reception signal that is output from the VGA 5. The HPF 6 sets the cutoff frequency $f_c$ on the basis of the cutoff frequency code $f_{cc}$ that is output from the AGC controller 9, and stops part, in a band lower than the thus-set cutoff frequency $f_c$, of the received reception signal. The HPF 6 passes the other part, in a band higher than or equal to the thus-set cutoff frequency $f_c$, of the reception signal, and outputs it to the ADC 7.

The ADC 7 receives the reception signal that is output from the HPF 6, and generates a digital reception signal by AD-converting the received analog reception signal. The ADC 7 outputs the generated (AD-converted) digital reception signal to the DSP 8.

The DSP 8 receives the reception signal that is output from the ADC 7, and modulates the received reception signal by performing digital signal processing according to a prescribed demodulation method. The digital value of a received reception signal level as input to the DSP 8 is output to the downstream stage of the receiver 1000 and the AGC controller 9. The DSP 8 may be replaced by another kind of processor such as a CPU (central processing unit).

The AGC controller 9 outputs, to the adder 11, a gain code $D_{VGA}$ specifying an optimum gain of the VGAs 3 and 5 in an AGC period of a preamble period and a signal reception period after the preamble period.

In each of the following embodiments, it is assumed that an optimum reception level in an AGC period and a signal reception period is known in advance for the operation of the AGC controller 9.

In gain adjustment in an AGC period, the AGC controller 9 compares the digital value of a reception signal level that is output from the DSP 8 with the optimum reception signal level that is determined from the dynamic range of the ADC 7. Based on the comparison result, the AGC controller 9 determines a gain code $D_{VGA}$ that specifies a gain that matches the dynamic range of the ADC 7.

The AGC controller 9 outputs a cutoff frequency code $f_{cc}$ to the HPFs 4 and 6 and thereby sets a cutoff frequency $f_c$ of the HPFs 4 and 6. More specifically, at the start of an AGC period, the AGC controller 9 sets the cutoff frequency $f_c$ of the HPFs 4 and 6 to a second cutoff frequency $f_{c\_wide}$ that is higher than a first cutoff frequency $f_{c\_norm}$. Before the end of the AGC period, the AGC controller 9 sets the cutoff frequency $f_c$ of the HPFs 4 and 6 to the first cutoff frequency $f_{c\_norm}$.

After setting the cutoff frequency $f_c$ of the HPFs 4 and 6 to the second cutoff frequency $f_{c\_wide}$, the AGC controller 9 outputs, to the VGA gain corrector 10, a correction instruction to increase the gain of the VGAs 3 and 5 by a prescribed amount.

The VGA gain corrector 10 corrects the gain of the VGAs 3 and 5 by a prescribed amount. The VGA gain corrector 10 receives the correction instruction that is output from the AGC controller 9, and calculates a gain correction code $D_{coef}$ that specifies a correction amount for the gain of the VGAs 3 and 5 on the basis of the received correction instruction.

The VGA gain corrector 10 outputs the calculated gain correction code $D_{coef}$ to the adder 11. The correction instruction contains the cutoff frequency code $f_{cc}$ that is output from the AGC controller 9.

The VGA gain corrector 10 sets the correction amount for the gain of the VGAs 3 and 5 to a first correction amount after the cutoff frequency $f_c$ of the HPFs 4 and 6 has been set to a second cutoff frequency $f_{c\_wide}$. The first correction amount is a gain ($D_{wide} \times G_{step}$) that corresponds to a gain correction code $D_{wide}$ that is calculated by a calculation method to be described later.

The VGA gain corrector 10 sets the correction amount for the gain of the VGAs 3 and 5 to a second correction amount after the cutoff frequency $f_c$ of the HPFs 4 and 6 has been set to the first cutoff frequency $f_{c\_norm}$. For example, the second correction amount is a zero gain corresponding to a gain correction code "0 (zero)."

A specific method by which the VGA gain corrector 10 calculates a gain correction code $D_{coef}$ will be described. In each of the following embodiments, the gain correction code $D_{coef}$ is equal to either $D_{wide}$ or 0 (refer to Equation (4)).

[Formula 4]

$$D_{coef} = \left\{ \begin{array}{c} D_{wide} \\ 0 \end{array} \right\} \qquad (4)$$

$D_{wide}$ is a gain correction code that specifies a gain that is equal to a gain reduction amount $G_{diff}$ of the gain of the VGAs 3 and 5 that occurs when the cutoff frequency $f_c$ of the HPFs 4 and 6 is re-set from the first cutoff frequency $f_{c\_norm}$ to a second cutoff frequency $f_{c\_wide}$. Therefore, the difference between the gain corresponding to $D_{wide}$ and the zero gain corresponding to "0" is equal to a gain reduction amount $G_{diff}$ of the gain of the VGAs 3 and 5 that occurs when the cutoff frequency $f_c$ of the HPFs 4 and 6 is set to a second cutoff frequency $f_{c\_wide}$.

The VGA gain corrector 10 calculates a gain correction code $D_{wide}$ according to Equation (5). In Equation (5), round ($G_{diff}/G_{step}$) is an operator of rounding off $G_{diff}/G_{step}$ to the nearest integer. $G_{step}$ represents an average of variation amounts of the gain of the VGAs 3 and 5 of the 1000 that occur when the gain code $D_{VGA}$ is varied by one code, and is given by Equation (6).

[Formula 5]

$$D_{wide} = \text{round}\left(\frac{G_{diff}}{G_{step}}\right) \qquad (5)$$

[Formula 6]

$$G_{step} = \frac{G(D_{max}) - G(D_{min})}{D_{max} - D_{min}} \; [\text{dB}] \qquad (6)$$

In Equation (6), $D_{max}$ represents a maximum gain code value, $D_{min}$ represents a minimum gain code value, $G(D_{max})$ represents an addition value of gains of the VGAs 3 and 5 corresponding to the maximum gain code value, and $G(D_{min})$ represents an addition value of gains of the respective VGAs 3 and 5 corresponding to the minimum gain code value.

In each of the following embodiments, it is assumed that the gain reduction amount $G_{diff}$ has been measured in advance through a simulation or an actual measurement and hence is known.

The adder 11 corrects the gain of the VGAs 3 and 5 by a prescribed amount. The adder 11 receives and adds together the gain code $D_{VGA}$ that is output from the AGC controller 9 and the gain correction code $D_{coef}$ that is output from the VGA gain corrector 10. The addition value of the gain code $D_{VGA}$ and the gain correction code $D_{coef}$ is represented by $D_{VGA\_comp}$. The adder 11 outputs the gain code addition value $D_{VGA\_comp}$ to the VGAs 3 and 5.

Figure 4:
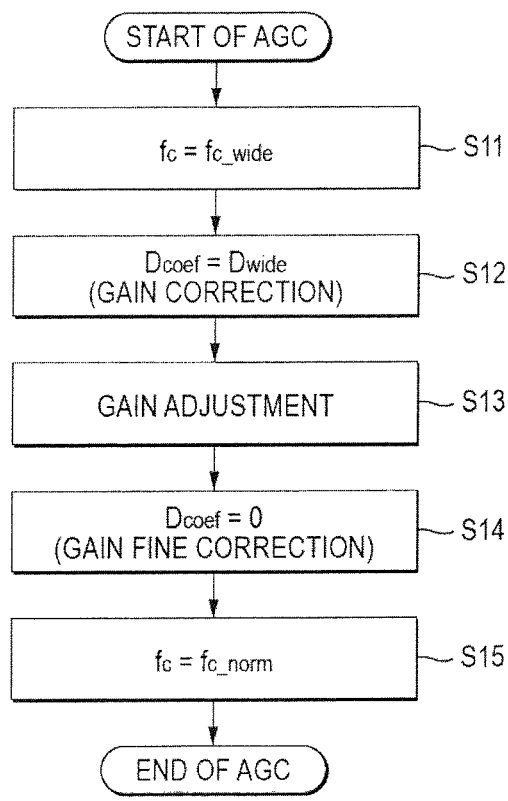
FIG. 4 is a flowchart showing how the reception circuit according to the first embodiment operates in an AGC period.

Next, how the reception circuit 100 operates in an AGC period will be described with reference to FIG. 4. FIG. 4 is a flowchart showing how the reception circuit 100 according to the first embodiment operates in an AGC period.

Referring to FIG. 4, upon a start of AGC, the AGC controller 9 outputs, to the adder 11, a gain code $D_{VGA}$ that specifies a known optimum gain of the VGAs 3 and 5.

The AGC controller 9 sets the cutoff frequency code $f_{cc}$ for the HPFs 4 and 6 to a second cutoff frequency code $f_{cc\_wide}$. That is, the AGC controller 9 sets the cutoff frequency $f_c$ of the HPFs 4 and 6 to a second cutoff frequency $f_{c\_wide}$ (S11). The second cutoff frequency code is a code corresponding to the second cutoff frequency $f_{cc\_wide}$.

After setting the cutoff frequency $f_c$ of the HPFs 4 and 6 to the second cutoff frequency $f_{c\_wide}$, the AGC controller 9 outputs, to the VGA gain corrector 10, a correction instruction to increase the gain of the VGAs 3 and 5 by a prescribed amount.

The VGA gain corrector 10 calculates a gain correction code $D_{coef}$ specifying a correction amount for the gain of the VGAs 3 and 5 on the basis of the correction instruction that is output from the AGC controller 9. That is, after the cutoff frequency $f_c$ of the HPFs 4 and 6 has been set to the second cutoff frequency $f_{c\_wide}$, the VGA gain corrector 10 calculates a gain correction code $D_{wide}$ that specifies a correction amount (first correction amount) for the gain of the VGAs 3 and 5 and sets it as $D_{coef}$ ($D_{coef}=D_{wide}$) (S12). The VGA gain corrector 10 outputs the thus-set gain correction code $D_{coef}$ to the adder 11.

After the gain correction code $D_{coef}$ has been set to $D_{wide}$, the gain of the VGAs 3 and 5 is adjusted by the AGC controller 9, the VGA gain corrector 10, and the adder 11 (S13). How the gain of the VGAs 3 and 5 is adjusted will be described below.

For example, the adder 11 receives and adds together a gain code $D_{VGA}$ that is output from the AGC controller 9 and a gain correction code $D_{coef}$ that is output from the VGA gain corrector 10. The adder 11 outputs a resulting gain code $D_{VGA\_comp}$ to each of the VGAs 3 and 5.

The AGC controller 9 judges, through comparison, whether the digital value of a reception signal level that is input to the DSP 8 via the VGAs 3 and 5 whose gain has been corrected on the basis of the gain code $D_{VGA\_comp}$ that is output from the adder 11 is equal or approximately equal to an optimum reception signal level.

The gain of the VGAs 3 and 5 is adjusted repeatedly by the AGC controller 9, the VGA gain corrector 10, and the adder 11 until the digital value of the reception signal level becomes equal or approximately equal to the optimum reception signal level.

That is, when the cutoff frequency $f_c$ of the HPFs 4 and 6 has been set to the second cutoff frequency $f_{c\_wide}$ in the AGC period, the gain of the VGAs 3 and 5 is corrected on the basis of a gain code $D_{VGA\_comp}$ that is output from the adder 11. As a result, the gain of the VGAs 3 and 5 is increased by ($D_{wide} \times G_{step}$) to $\{G(13)-G_{diff}+(D_{wide} \times G_{step})\}$ and becomes equal or approximately equal to an optimum gain G(13) (see FIG. 5).

If judging that the digital value of the reception signal level becomes equal or approximately equal to the optimum reception signal level, the AGC controller 9 judges that the adjustment of the gain of the VGAs 3 and 5 should be finished.

Upon completion of the adjustment of the gain of the VGAs 3 and 5 in the AGC period, the AGC controller 9 outputs, to the VGA gain corrector 10, a correction finish instruction to finish the correction for increasing the gain of the VGAs 3 and 5 by a prescribed amount.

The VGA gain corrector 10 sets the gain correction code $D_{coef}$ specifying a correction amount (second correction amount) for the gain of the VGAs 3 and 5 to "0" (S14). The VGA gain corrector 10 outputs the thus-set gain correction code $D_{coef}$ to the adder 11.

The AGC controller 9 sets the cutoff frequency code k for the HPFs 4 and 6 to a first cutoff frequency code $f_{cc\_norm}$. That is, the AGC controller 9 sets the cutoff frequency $f_c$ of the HPFs 4 and 6 to a first cutoff frequency $f_{c\_norm}$ (S15). The first cutoff frequency code $f_{cc\_norm}$ is a code corresponding to the first cutoff frequency $f_{c\_norm}$. The operation of the reception circuit 100 in the AGC period is thus finished.

With the above operation, the reception circuit 100 and the receiver 1000 according to the first embodiment can prevent the phenomenon that the error rate of a reception signal increases due to gain reduction of an amount $G_{diff}$ occurring in an AGC period and a signal reception period because of re-setting by AGC of the cutoff frequency $f_c$ of the HPFs 4 and 6 from a first cutoff frequency $f_{c\_norm}$ to a second cutoff frequency $f_{c\_wide}$.

Figure 5:
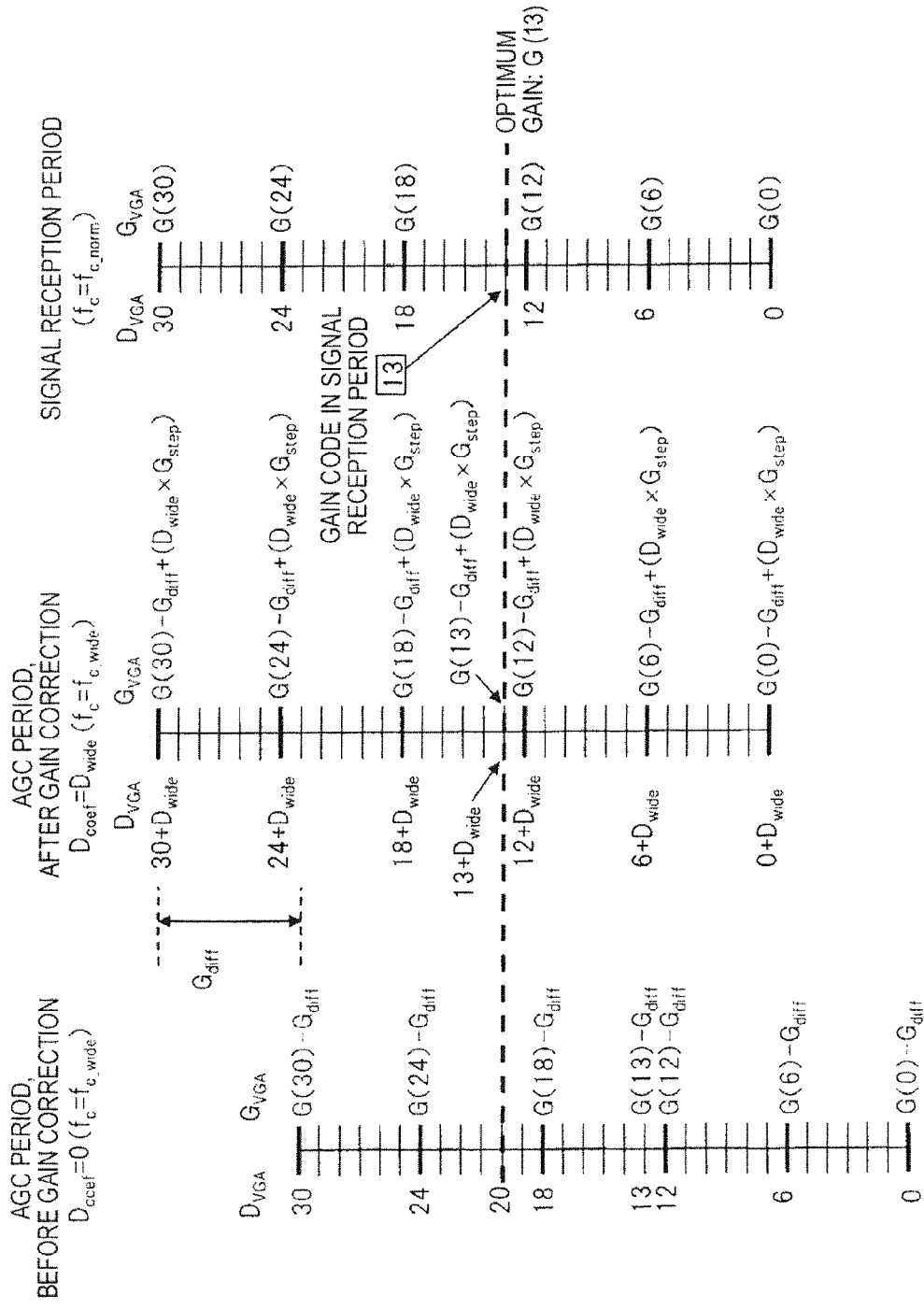
FIG. 5 illustrates advantages of the reception circuit and the receiver according to the first embodiment.

FIG. 5 illustrates advantages of the reception circuit 100 and the receiver 1000 according to the first embodiment.

The scale in the left part of FIG. 5, which corresponds to step S11 shown in FIG. 4, shows a corresponding relationship between the gain code $D_{VGA}$ and the gain $G_{VGA}$ of the VGAs 3 and 5 in a case that the cutoff frequency $f_c$ is set to the second cutoff frequency $f_{c\_wide}$ and the gain correction code $D_{coef}$ remains "0" in an AGC period.

The scale in the middle part of FIG. 5, which corresponds to step S12 shown in FIG. 4, shows a corresponding relationship between the gain code $D_{VGA}$ and the gain $G_{VGA}$ of the VGAs 3 and 5 in a case that the cutoff frequency $f_c$ is set to the second cutoff frequency $f_{c\_wide}$ and the gain correction code $D_{coef}$ is set to $D_{wide}$ in the AGC period.

The scale in the right part of FIG. 5 shows a corresponding relationship between the gain code $D_{VGA}$ and the gain $G_{VGA}$ of the VGAs 3 and 5 in a case that the cutoff frequency $f_c$ is set to the first cutoff frequency $f_{c\_norm}$ in a signal reception period after the end of the AGC period.

If the cutoff frequency $f_c$ of the HPFs 4 and 6 is at the second cutoff frequency $f_{c\_wide}$ and the gain correction code $D_{coef}$ remains "0" (step S11 shown in FIG. 4), the gain of the VGAs 3 and 5 decreases by a gain reduction amount $G_{diff}$.

Therefore, in the reception circuit 100, in the AGC period, after the cutoff frequency $f_c$ of the HPFs 4 and 6 is set to the second cutoff frequency $f_{c\_wide}$, the VGA gain corrector 10 sets the gain correction code $D_{coef}$ to $D_{wide}$ (first correction amount) (S12 shown in FIG. 4).

With the above measure, in the AGC period, the gain of the VGAs 3 and 5 is increased as a whole by an amount ($D_{wide} \times G_{step}$) that corresponds to the gain correction code $D_{coef}$ (=$D_{wide}$) and a gain $\{G(13)-G_{diff}+(D_{wide} \times G_{step})\}$ which is equal or approximately equal to the desired optimum gain G(13) is set in the VGAs 3 and 5.

As a result, though the cutoff frequency $f_c$ reverts to the first cutoff frequency $f_{c\_norm}$ in the signal reception period, the optimum gain G(13) can be set in the VGAs 3 and 5.

Therefore, in the reception circuit 100 and the receiver 1000, the gain of the VGAs can be set to the optimum gain in an AGC period and hence error rate increase can be prevented in a signal reception period.

(Modification of Embodiment 1)

Figure 6:
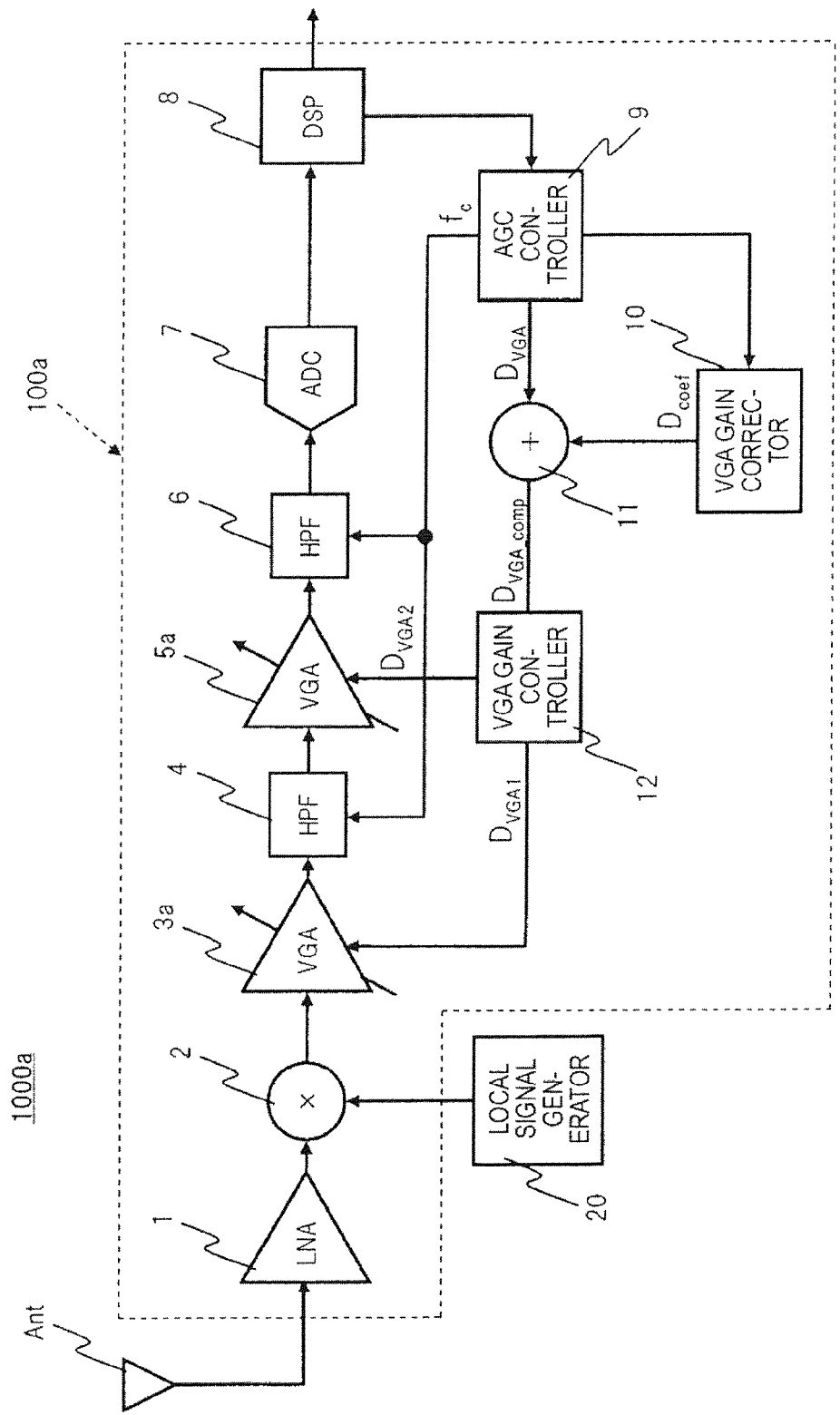
FIG. 6 is a block diagram showing the circuit configuration of a reception circuit and a receiver according to a first modification of the first embodiment.

FIG. 6 is a block diagram showing the circuit configuration of a reception circuit 100a and a receiver 1000a according to a first modification of the first embodiment. In the first modification of the first embodiment, the reception circuit 100a and the receiver 1000a further include a VGA gain controller 12 for correcting VGA gains. Constituent elements having the same ones in the first embodiment will be given the same symbols as the latter and descriptions therefor will be omitted.

The VGA gain controller 12 receives an addition value $D_{VGA\_comp}$ of a gain code $D_{VGA}$ that is output from the adder 11 and a gain correction code $D_{coef}$. The VGA gain controller 12 outputs the same or different gain codes to respective VGAs 3 and 5 on the basis of the received addition value $D_{VGA\_comp}$.

Figure 7:
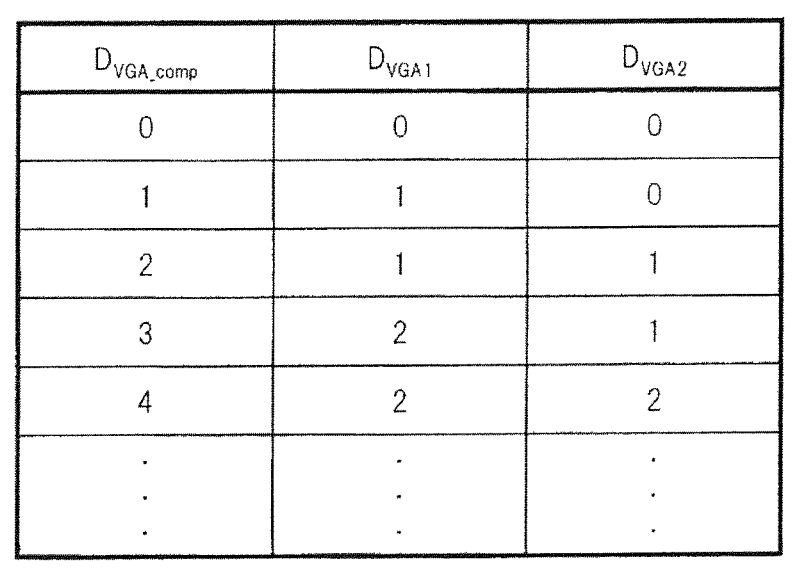

More specifically, the VGA gain controller 12 outputs the same or different gain codes $D_{VGA1}$ and $D_{VGA2}$ to the respective VGAs 3 and 5 on the basis of the received addition value $D_{VGA\_comp}$ by referring to an LUT (lookup table) shown in FIG. 7. FIG. 7 shows the structure of an example lookup table. The lookup table may be stored in a memory unit (e.g., RAM (random access memory)) not shown in FIG. 6 or the contents of the lookup table may be prescribed in advance for the operation of the VGA gain controller 12.

The lookup table prescribes values of the addition value $D_{VGA\_comp}$ which is input to the VGA gain controller 12, a gain code $D_{VGA1}$ to be input to the VGA 3, and a gain code $D_{VGA2}$ to be input to the VGA 5. For example, if the addition value $D_{VGA\_comp}$ that is input to the VGA gain controller 12 is "3," a gain code $D_{VGA1}$ "2" is output to the VGA 3 and a gain code $D_{VGA2}$ "1" is output to the VGA 5.

The VGA 3a corrects its gain on the basis of the gain code $D_{VGA1}$ that is output from the VGA gain controller 12, and amplifies or attenuates the level of a reception signal that is output from the mixer 2, using the corrected gain. The VGA 3a outputs the level-amplified or attenuated reception signal to the HPF 4.

The VGA 5a corrects its gain on the basis of the gain code $D_{VGA2}$ that is output from the VGA gain controller 12, and amplifies or attenuates the level of a reception signal that is output from the mixer 2, using the corrected gain. The VGA 5a outputs the level-amplified or attenuated reception signal to the HPF 6.

With the above-described configuration, the reception circuit 100a and the receiver 1000a according to the first modification of the first embodiment can provide the same advantages as the reception circuit 100 and the receiver 1000 according to the first embodiment.

(Modification 2 of Embodiment 1)

Figure 8:
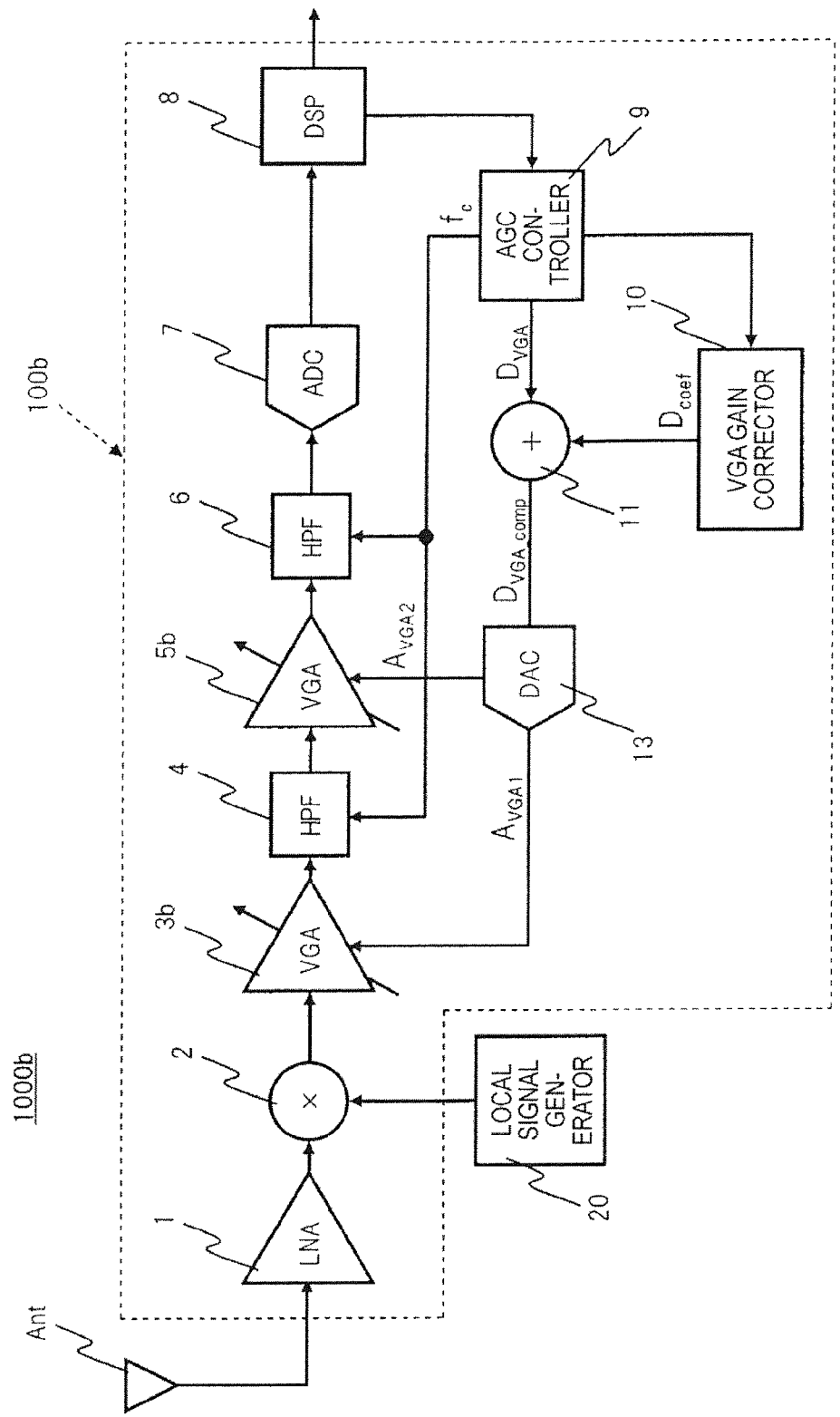
FIG. 8 is a block diagram showing the circuit configuration of a reception circuit and a receiver according to a second modification of the first embodiment.

FIG. 8 is a block diagram showing the circuit configuration of a reception circuit 100b and a receiver 1000b according to a second modification of the first embodiment. In the second modification of the first embodiment, the reception circuit 100b and the receiver 1000b further include a DAC (digital-to-analog converter) 13 for correcting VGA gains. Constituent elements having the same ones in the first embodiment will be given the same symbols as the latter and descriptions therefor will be omitted.

The DAC 13 receives an addition value $D_{VGA\_comp}$ of a gain code $D_{VGA}$ that is output from the adder 11 and a gain correction code $D_{coef}$. The DAC 13 converts DA-converts the received digital addition value $D_{VGA\_comp}$ and thereby generates the same or different analog VGA gain control voltages $A_{VGA1}$ and $A_{VGA2}$. In the case of generating different analog VGA gain control voltages $A_{VGA1}$ and $A_{VGA2}$, the DAC 13 does so, for example, according to a ratio that is prescribed in advance for its operation. The ratio (VGA control voltage for a VGA 3):(VGA control voltage for a VGA 5) is set at 3:2, for example.

The VGA 3b corrects its gain on the basis of the gain code $D_{VGA1}$ that is output from the DAC 13, and amplifies or attenuates the level of a reception signal that is output from the mixer 2, using the corrected gain. The VGA 3b outputs the level-amplified or attenuated reception signal to the HPF 4.

The VGA 5b corrects its gain on the basis of the gain code $D_{VGA2}$ that is output from the DAC 13, and amplifies or attenuates the level of a reception signal that is output from the mixer 2, using the corrected gain. The VGA 5b outputs the level-amplified or attenuated reception signal to the HPF 6.

With the above-described configuration, the reception circuit 100b and the receiver 1000b according to the second modification of the first embodiment can provide the same advantages as the reception circuit 100 and the receiver 1000 according to the first embodiment.

Embodiment 2

Because a reception circuit and a receiver according to a second embodiment are similar in configuration to the reception circuit 100 and the receiver 1000 according to the first embodiment, a block diagram showing their circuit configurations is omitted and they will be described using the same reference symbols as in the first embodiment. Constituent elements having the same ones in the first embodiment will be given the same symbols as the latter and descriptions therefor will be omitted.

In the second embodiment, the gain adjustment in an AGC period is divided into two stages, that is, a rough adjustment and a fine adjustment. In the rough adjustment, the cutoff frequency $f_c$ of the HPFs 4 and 6 is set to a second cutoff frequency $f_{c\_wide}$. In the fine adjustment, the cutoff frequency $f_c$ of the HPFs 4 and 6 is set to a first cutoff frequency $f_{c\_norm}$.

Figure 9:
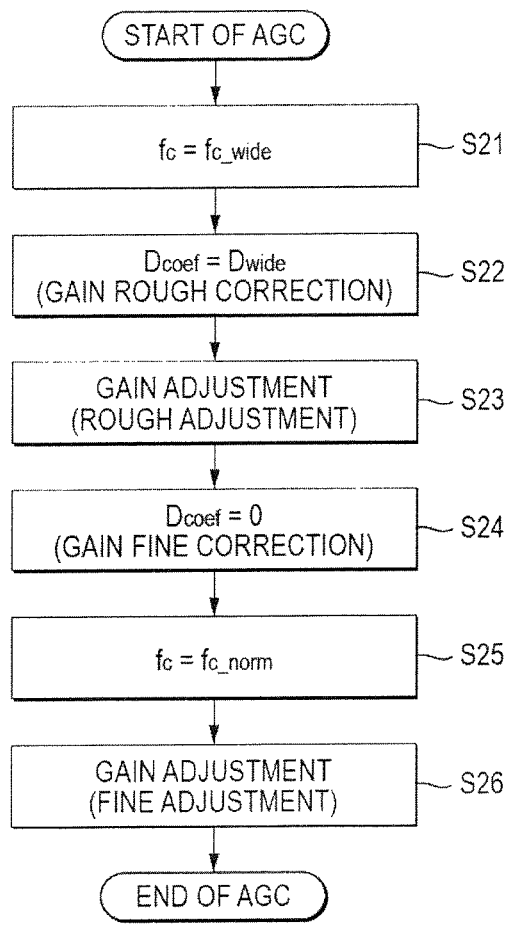
FIG. 9 is a flowchart showing how a reception circuit according to a second embodiment operates in an AGC period.

How the reception circuit 100 according to the second embodiment operates in an AGC period will be described with reference to FIG. 9. FIG. 9 is a flowchart showing how the reception circuit 100 according to the second embodiment operates in an AGC period. In this embodiment, an AGC period includes a rough adjustment period and a fine adjustment period.

Referring to FIG. 9, upon a start of an AGC rough adjustment, the AGC controller 9 outputs, to the adder 11, a gain code $D_{VGA}$ that specifies a known optimum gain of the VGAs 3 and 5.

The AGC controller 9 sets the cutoff frequency code $f_{cc}$ for the HPFs 4 and 6 to a second cutoff frequency code $f_{cc\_wide}$. That is, the AGC controller 9 sets the cutoff frequency $f_c$ of the HPFs 4 and 6 to a second cutoff frequency $f_{c\_wide}$ (S21).

After setting the cutoff frequency $f_c$ of the HPFs 4 and 6 to the second cutoff frequency $f_{c\_wide}$, the AGC controller 9 outputs, to the VGA gain corrector 10, a rough correction instruction to increase the gain of the VGAs 3 and 5 by a prescribed amount.

The VGA gain corrector 10 calculates a gain correction code $D_f$ specifying a correction amount for the gain of the VGAs 3 and 5 on the basis of the rough correction instruction that is output from the AGC controller 9. That is, after the cutoff frequency $f_c$ of the HPFs 4 and 6 has been set to the second cutoff frequency $f_{c\_wide}$, the VGA gain corrector 10 calculates a gain correction code $D_{wide}$ that specifies a correction amount (first correction amount) for the gain of the VGAs 3 and 5 and sets it as $D_{coef}$ ($D_{coef}=D_{wide}$) (S22). The VGA gain corrector 10 outputs the thus-set gain correction code $D_{coef}$ to the adder 11.

After the gain correction code $D_{coef}$ has been set to $D_{wide}$, the gain of the VGAs 3 and 5 is adjusted roughly by the AGC controller 9, the VGA gain corrector 10, and the adder 11 (S23). How the gain of the VGAs 3 and 5 is adjusted roughly will be described below.

Based on the above description, it is assumed that in the AGC rough adjustment the convergence range of the gain code $D_{VGA}$ is a six-code range. Therefore, the gain code $D_{VGA}$ that has been converged in the rough adjustment period shown in FIG. 10 as a result of the AGC rough adjustment is judged within, for example, a range of ($6+D_{wide}$) to ($12+D_{wide}$) or ($12+D_{wide}$) to ($18+D_{wide}$).

For example, the adder 11 receives and adds together a gain code $D_{VGA}$ that is output from the AGC controller 9 and a gain correction code $D_{coef}$ that is output from the VGA gain corrector 10. The adder 11 outputs a resulting gain code $D_{VGA\_comp}$ to each of the VGAs 3 and 5.

The DSP 8 outputs the digital value of a reception signal level via the VGAs 3 and 5 whose gain has been corrected on the basis of the gain code $D_{VGA\_comp}$ that is output from the adder 11. The AGC controller 9 judges, through comparison, whether the digital value of the reception signal level is equal or approximately equal to an optimum reception signal level.

The rough adjustment of the gain of the VGAs 3 and 5 is performed repeatedly by the AGC controller 9, the VGA gain corrector 10, and the adder 11 until the digital value of the reception signal level becomes equal or approximately equal to the optimum reception signal level.

That is, when the cutoff frequency $f_c$ of the HPFs 4 and 6 has been set to the second cutoff frequency $f_{c\_wide}$ in the AGC rough adjustment period, the gain of the VGAs 3 and 5 is corrected on the basis of a gain code $D_{VGA\_comp}$ that is output from the adder 11. As a result, the gain of the VGAs 3 and 5 is increased by $D_{wide} \times G_{step}$. It is judged that the gain of the VGAs 3 and 5 becomes equal or approximately equal to an optimum gain G(13) as a result of the AGC rough adjustment in the case where the gain code is in the range of ($12+D_{wide}$) to ($18+D_{wide}$), that is, the gain is in a range of {G(12)−$G_{diff}$+($D_{wide} \times G_{step}$)} to {G(18)−$G_{diff}$+($D_{wide} \times G_{step}$)} (see FIG. 10).

If judging that the digital value of the reception signal level becomes equal or approximately equal to the optimum reception signal level, the AGC controller 9 judges that the rough adjustment of the gain of the VGAs 3 and 5 should be finished. That is, as a result of the AGC rough adjustment the AGC controller 9 judges that the convergence range of the gain code $D_{VGA}$ that specifies the gain of the VGAs 3 and 5 is ($12+D_{wide}$) to ($18+D_{wide}$)

Upon completion of the AGC rough adjustment of the gain of the VGAs 3 and 5, the AGC controller 9 outputs, to the VGA gain corrector 10, a rough adjustment finish instruction to finish the correction for increasing the gain of the VGAs 3 and 5 by a prescribed amount.

The VGA gain corrector 10 sets the gain correction code $D_f$ specifying a correction amount (second correction amount) for the gain of the VGAs 3 and 5 to "0" (S24). The VGA gain corrector 10 outputs the thus-set gain correction code $D_{coef}$ to the adder 11.

The AGC controller 9 sets the cutoff frequency code k for the HPFs 4 and 6 to a first cutoff frequency code $f_{c\_norm}$. That is, the AGC controller 9 sets the cutoff frequency $f_c$ of the HPFs 4 and 6 to a first cutoff frequency $f_{c\_norm}$ (S25).

After the cutoff frequency $f_c$ of the HPFs 4 and 6 has been set to the first cutoff frequency code $f_{c\_norm}$, the AGC controller 9 adjusts the gain of the VGAs 3 and 5 finely (S26). How the gain of the VGAs 3 and 5 is adjusted finely will be described below.

Based on the above description, it is assumed that in the AGC fine adjustment the convergence range of the gain code $D_{VGA}$ is a one-code range.

Figure 10:
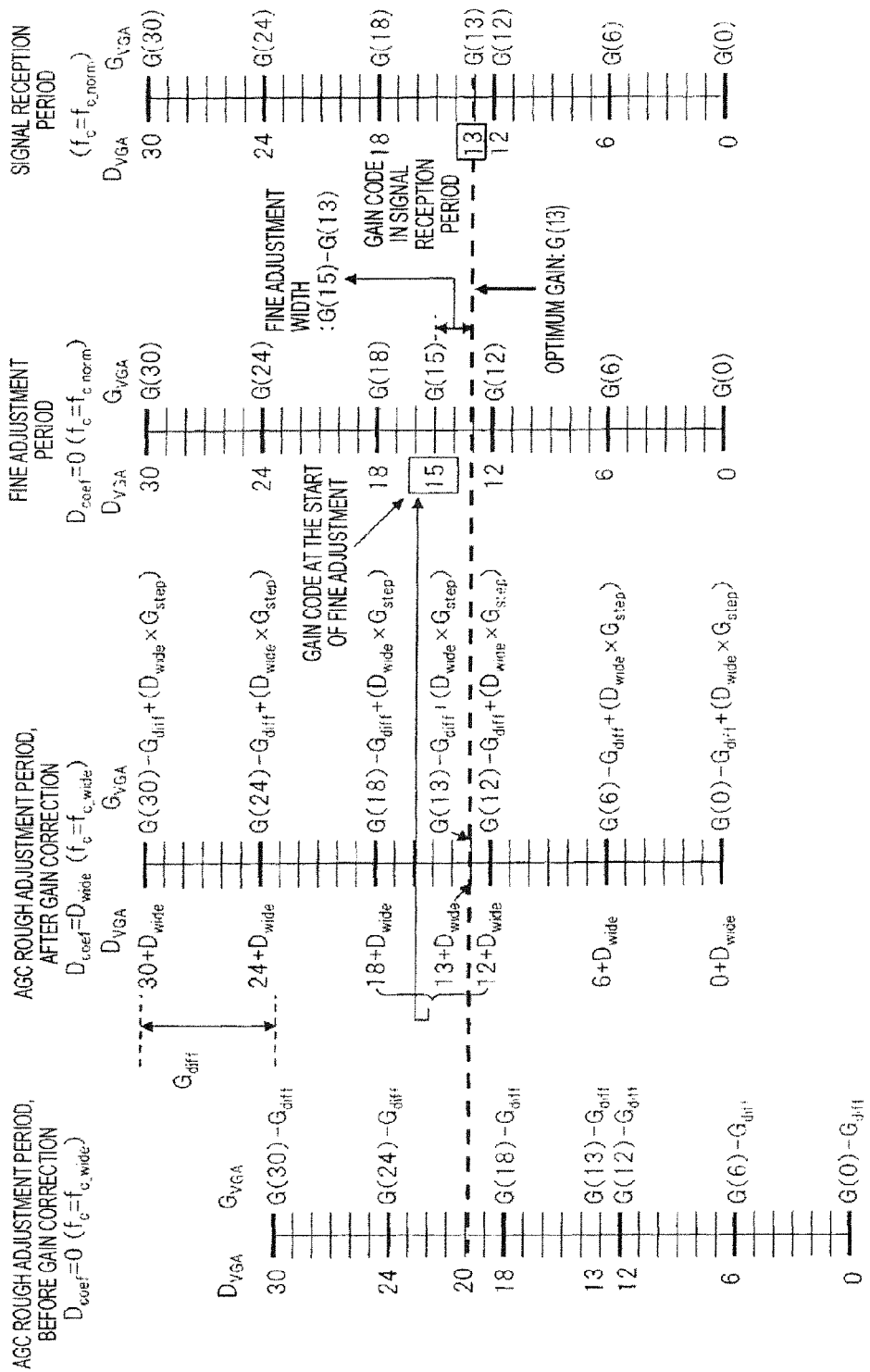
FIG. 10 illustrates advantages of the reception circuit and the receiver according to the second embodiment.

Therefore, the gain code $D_{VGA}$ that has been converged in the fine adjustment period shown in FIG. 10 as a result of the AGC fine adjustment is judged to be, for example, ($12+D_{wide}$) or ($13+D_{wide}$).

For example, the AGC controller 9 judges that the gain code specifying a gain of the VGAs 3 and 5 at the start of the AGC fine adjustment is the middle point ($D_{VGA}$=15) (which corresponds to the gain correction code $D_{coef}$ being equal to "0") of the gain code range ($12+D_{wide}$) to ($18+D_{wide}$) which is the judgment result of the AGC rough adjustment.

The AGC controller 9 outputs the determined gain code $D_{VGA}$ to each of the VGSs 3 and 5. The AGC controller 9 judges, through comparison, whether the digital value of a reception signal level that is output from the DSP 8 via the VGAs 3 and 5 whose gain has been corrected on the basis of the gain code $D_{VGA}$ that is output from the AGC controller 9 is equal to an optimum reception signal level.

The gain of the VGAs 3 and 5 is adjusted repeatedly by the AGC controller 9 until the digital value of the reception signal level becomes equal to the optimum reception signal level.

That is, when the cutoff frequency $f_c$ of the HPFs 4 and 6 has been set to the first cutoff frequency $f_{c\_norm}$ in the AGC fine adjustment period, the gain of the VGAs 3 and 5 is corrected on the basis of a gain code $D_{VGA}$ that is output from the AGC controller 9. As a result, the gain of the VGAs 3 and 5 becomes equal to the optimum gain G(13) as a result of the AGC fine adjustment (see FIG. 10).

If judging that the digital value of the reception signal level becomes equal to the optimum reception signal level, the AGC controller 9 judges that the fine adjustment of the gain of the VGAs 3 and 5 should be finished. That is, as a result of the AGC fine adjustment, the AGC controller 9 judges that the gain code $D_{VGA}$ specifying the gain of the VGAs 3 and 5 should be equal to "13." The operation of the reception circuit 100 in the AGC period is thus finished.

With the above operation, the reception circuit 100 and the receiver 1000 according to the second embodiment provides, in addition to the advantages of the reception circuit 100 and the receiver 1000 according to the first embodiment, an advantage that high accuracy can be attained because of the two-stage AGC that consists of rough adjustment and fine adjustment.

FIG. 10 illustrates advantages of the reception circuit 100 and the receiver 1000 according to the second embodiment. The scale in the leftmost part of FIG. 10 corresponds to a state before a gain correction to be performed in a rough adjustment period of an AGC period. This scale shows a corresponding relationship between the gain code $D_{VGA}$ and the gain $G_{VGA}$ of the VGAs 3 and 5 in a case that the cutoff frequency $f_c$ is set to the second cutoff frequency and the gain correction code $D_{coef}$ remains "0"

The scale in the second left part of FIG. 10 corresponds to a state after the gain correction performed in the rough adjustment period of the AGC period. This scale shows a corresponding relationship between the gain code $D_{VGA}$ and the gain $G_{VGA}$ of the VGAs 3 and 5 in a case that the cutoff frequency $f_c$ is set to the second cutoff frequency $f_{c\_wide}$ and the gain correction code $D_{coef}$ is set to $D_{wide}$.

The scale in the second right part of FIG. 10 corresponds to a fine adjustment period of the AGC period. This scale shows a corresponding relationship between the gain code $D_{VGA}$ and the gain $G_{VGA}$ of the VGAs 3 and 5 in a case that the cutoff frequency $f_c$ is set to the first cutoff frequency f and the gain correction code $D_{coef}$ is set to "0."

The scale in the rightmost part of FIG. 10 corresponds to a signal reception period. This scale shows a corresponding relationship between the gain code $D_{VGA}$ and the gain $G_{VGA}$ of the VGAs 3 and 5 in a case that the cutoff frequency $f_c$ is set to the first cutoff frequency $f_{c\_norm}$.

If the cutoff frequency $f_c$ of the HPFs 4 and 6 is at the second cutoff frequency $f_{c\_wide}$ and the gain correction code $D_{coef}$ is set to "0," the gain of the VGAs 3 and 5 decreases by a gain reduction amount $G_{diff}$.

In the reception circuit 100, in the AGC rough adjustment period, after the cutoff frequency $f_c$ of the HPFs 4 and 6 is set to the second cutoff frequency $f_{c\_wide}$, the VGA gain corrector 10 sets the gain correction code $D_{coef}$ to $D_{wide}$.

With the above measure, in the AGC rough adjustment period, the gain of the VGAs 3 and 5 is corrected and increased as a whole by an amount $(D_{wide} \times G_{step})$ that corresponds to the gain correction code $D_{coef}(=D_{wide})$. Therefore, it is judged that the gain $G_{VGA}$ of the VGAs 3 and 5 becomes equal or approximately equal to their optimum gain G(13) as a result of the AGC rough adjustment in the case where the gain code is in the range of $(12+D_{wide})$ to $(18+D_{wide})$, that is, the gain $G_{VGA}$ is in the range of $\{G(12)-G_{diff}+(D_{wide} \times G_{step})\}$ to $\{G(18)-G_{diff}+(D_{wide} \times G_{step})\}$.

In the reception circuit 100, in the AGC fine adjustment period, after the cutoff frequency $f_c$ of the HPFs 4 and 6 is set to the first cutoff frequency $f_{c\_norm}$ the VGA gain corrector 10 sets the gain correction code $D_{coef}$ to "0."

With these settings, in the AGC fine adjustment period, the difference from the optimum gain G(13) of the VGAs 3 and 5 is adjusted finely in a width of G(15)–G(13) in such a manner that the middle point ($D_{VGA}=15$) corresponding to the gain correction code $D_c$ being equal to "0" of the gain code range $(12+D_{wide})$ to $(18+D_{wide})$ determined as a result of the AGC rough adjustment serves as a starting point. After the AGC fine adjustment, the optimum gain G(13) of the VGAs 3 and 5 is set in the VGAs 3 and 5. Also in the signal reception period, the optimum gain G(13) is set in the VGAs 3 and 5.

Therefore, in the reception circuit 100 and the receiver 1000, in a fine adjustment, the error from a desired optimum gain can be made small in a fine adjustment period by performing a gain correction on the basis of a result of a rough adjustment, whereby the fine adjustment period can be shortened. Furthermore, also in a signal reception period, error rate increase can be prevented because the gain is set to the optimum gain in the AGC period.

Embodiment 3

Figure 11:
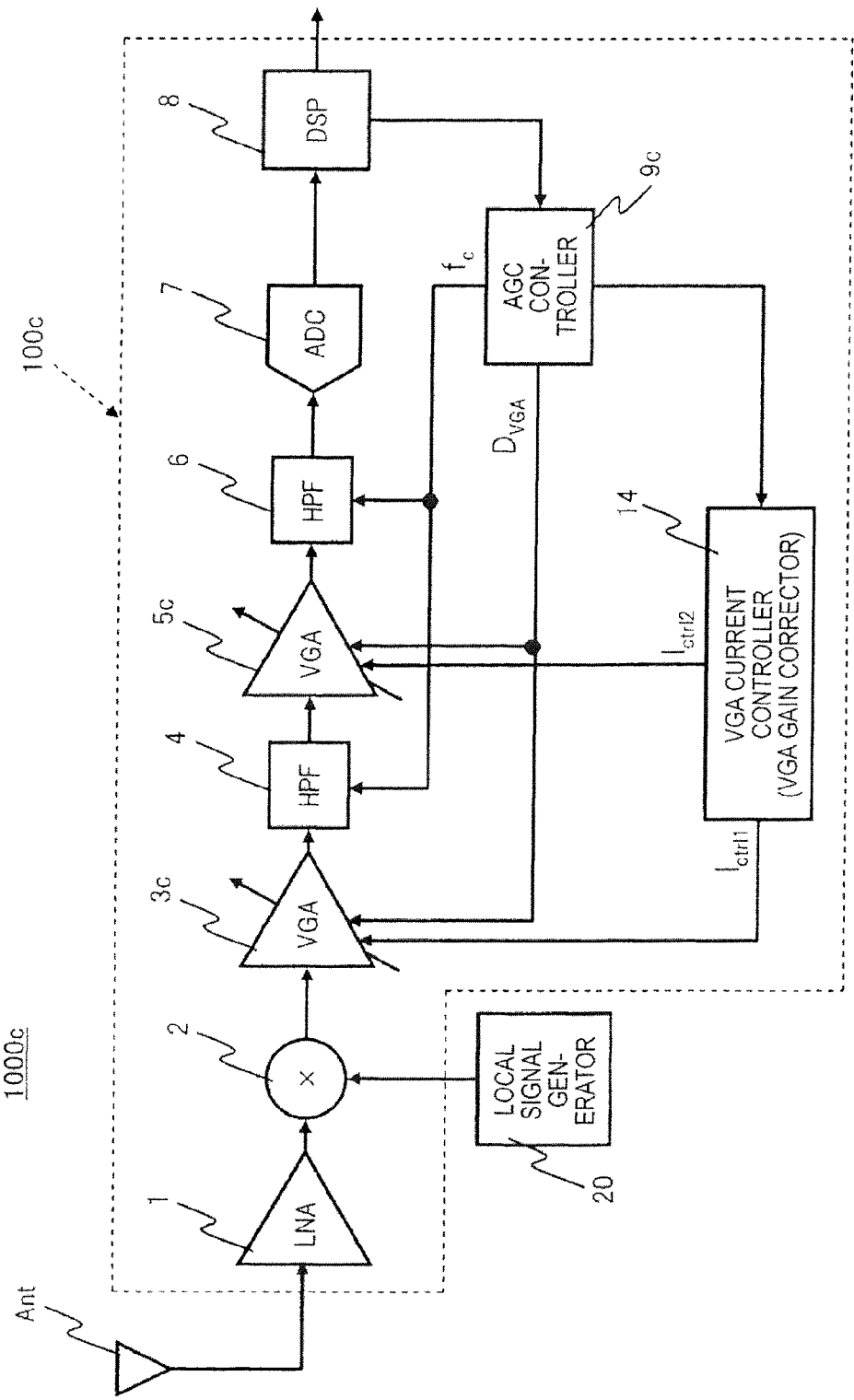
FIG. 11 is a block diagram showing the circuit configuration of a reception circuit and a receiver according to a third embodiment.

FIG. 11 is a block diagram showing the circuit configuration of a reception circuit 100c and a receiver 1000c according to a third embodiment. The reception circuit 100c and the receiver 1000c according to the third embodiment is different in configuration from the reception circuit 100 and the receiver 1000 shown in FIG. 3 in that a VGA current controller 14 is provided in place of the VGA gain corrector 10 and the adder 11.

That is, the receiver 1000c shown in FIG. 11 is configured so as to include a reception antenna Ant, a local signal generator 20, and the reception circuit 100c. The reception circuit 100c shown in FIG. 11 is configured so as to include an LNA 1, a mixer 2, a VGA 3c, an HPF 4, a VGA 5c, an HPF 6, an ADC 7, a DSP 8, an AGC controller 9c, and the VGA current controller 14. Constituent elements having the same ones in the first embodiment will be given the same symbols as the latter and descriptions therefor will be omitted.

The AGC controller 9c outputs a gain code $D_{VGA}$ for determining an optimum gain of the VGAs 3c and 5c in an AGC period of a preamble period and a signal reception period after the preamble period.

In an AGC gain adjustment period, the AGC controller 9c compares the digital value of a reception signal level that is output from the DSP 8 with the optimum reception signal level. Based on the comparison result, the AGC controller 9e determines a gain code $D_{VGA}$ that specifies a gain that matches the dynamic range of the ADC 7.

The AGC controller 9c outputs a cutoff frequency code $f_c$, to the HPFs 4 and 6 and thereby sets a cutoff frequency $f_c$ of the HPFs 4 and 6. More specifically, at the start of an AGC period, the AGC controller 9e sets the cutoff frequency $f_c$ of the HPFs 4 and 6 to a second cutoff frequency $f_{c\_wide}$. At the end of the AGC, the AGC controller 9c sets the cutoff frequency $f_c$ of the HPFs 4 and 6 to a first cutoff frequency $f_{c\_norm}$.

After setting the cutoff frequency $f_c$ of the HPFs 4 and 6 to the second cutoff frequency $f_{c\_wide}$ the AGC controller 9c outputs, to the VGA current controller 14, a correction instruction to increase the gain of the VGAs 3 and 5 by a prescribed amount.

After setting the cutoff frequency $f_c$ of the HPFs 4 and 6 to the first cutoff frequency $f_{c\_norm}$, the AGC controller 9c outputs, to the VGA current controller 14, a correction finish instruction to finish the correction for increasing the gain of the VGAs 3 and 5 by a prescribed amount.

The VGA current controller 14 for correcting the VGA gain corrects the gain of the VGAs 3 and 5 by a prescribed amount. The VGA current controller 14 receives the correction instruction that is output from the AGC controller 9c, and supplies the VGAs 3 and 5 with second bias currents $I_{ctrl1\_high}$ and $I_{ctrl2\_high}$ for increasing the gains of the VGAs 3 and 5 by prescribed amounts, respectively, on the basis of the received correction instruction.

After the cutoff frequency $f_c$ of the HPFs 4 and 6 has been set to the second cutoff frequency $f_{c\_wide}$, the VGA current controller 14 sets bias currents $I_{ctrl1}$ and $I_{ctrl2}$ that determine gain correction amounts of the VGAs 3 and 5 to second bias currents $I_{ctrl1\_norm}$ and $I_{ctrl2\_norm}$ that are larger than first bias currents $I_{ctrl1\_norm}$ and $I_{ctrl2\_norm}$, respectively.

After the cutoff frequency $f_c$ of the HPFs 4 and 6 has been set to the first cutoff frequency $f_{c\_wide}$, the VGA current controller 14 sets the bias currents $I_{ctrl1}$ and $I_{ctrl2}$ that determine gain correction amounts of the VGAs 3 and 5 to the first bias currents $I_{ctrl1\_norm}$ and $I_{ctrl2\_norm}$, respectively.

A specific method by which the VGA current controller 14 calculates bias currents $I_{ctrl1}$ and $I_{ctrl2\_high}$ will be described. In each of the following embodiments, the bias currents $I_{ctrl1}$ and $I_{ctrl2}$ are $I_{ctrl1\_norm}$ and $I_{ctrl2\_high}$ or $I_{ctrl1\_high}$ and $I_{ctrl2\_high}$, respectively (see Equations (7) and (8)).

[Formula 7]

$$I_{ctrl1} = \left\{ \begin{array}{c} I_{ctrl1\_norm} \\ I_{ctrl1\_high} \end{array} \right\} \quad (7)$$

-continued

[Formula 8]

$$I_{ctrl2} = \left\{ \begin{array}{l} I_{ctrl2\_norm} \\ I_{ctrl2\_high} \end{array} \right\} \quad (8)$$

The second bias currents $I_{ctrl1\_high}$ and $I_{ctrl2\_high}$ are bias currents for increasing the gain of the VGAs 3 and 5 by an amount that is equal or approximately equal to a gain reduction amount $G_{diff}$ of the VGAs 3 and 5 that is caused by setting the cutoff frequency $f_c$ of the HPFs 4 and 6 to the second cutoff frequency $f_{c\_wide}$. Therefore, the VGA current controller 14 sets the bias currents $I_{ctrl1}$ and $I_{ctrl2}$ to the second bias currents $I_{ctrl1\_high}$ and $I_{ctrl2\_high}$ when the cutoff frequency $f_c$ of the HPFs 4 and 6 has been set to the second cutoff frequency $f_{c\_wide}$.

With the above operation, the VGA current controller 14 can increase the gain of the VGAs 3 and 5 by an amount $G_{IUP}$ (see FIG. 13) that is equal or approximately equal to a gain reduction amount $G_{diff}$ of the VGAs 3 and 5 that is caused by setting the cutoff frequency $f_c$ of the HPFs 4 and 6 to the second cutoff frequency $f_{c\_wide}$. The VGA current controller 14 calculates first bias currents $I_{ctrl1\_high}$ and $I_{ctrl2\_high}$ high according to Equations (9):

[Formulae 9]

$$I_{ctrl1\_high} = I_{ctrl1\_norm} \cdot 10^{\frac{G_{eff}}{10}} \quad (9)$$
$$I_{ctrl2\_high} = I_{ctrl2\_norm} \cdot 10^{\frac{G_{eff}}{10}}$$

The VGA 3c corrects its gain on the basis of the gain code $D_{VGA}$ that is output from the AGC controller 9c and the bias current $I_{ctrl1}$ that is output from the VGA current controller 14, and amplifies or attenuates the level of a reception signal that is output from the mixer 2, using the corrected gain. The VGA 3c outputs the level-amplified or attenuated reception signal to the HPF 4.

The VGA 5c corrects its gain on the basis of the gain code D that is output from the AGC controller 9c and the bias current $I_{ctrl2}$ that is output from the VGA current controller 14, and amplifies or attenuates the level of a reception signal that is output from the mixer 2, using the corrected gain. The VGA 5c outputs the level-amplified or attenuated reception signal to the HPF 6.

Figure 12:
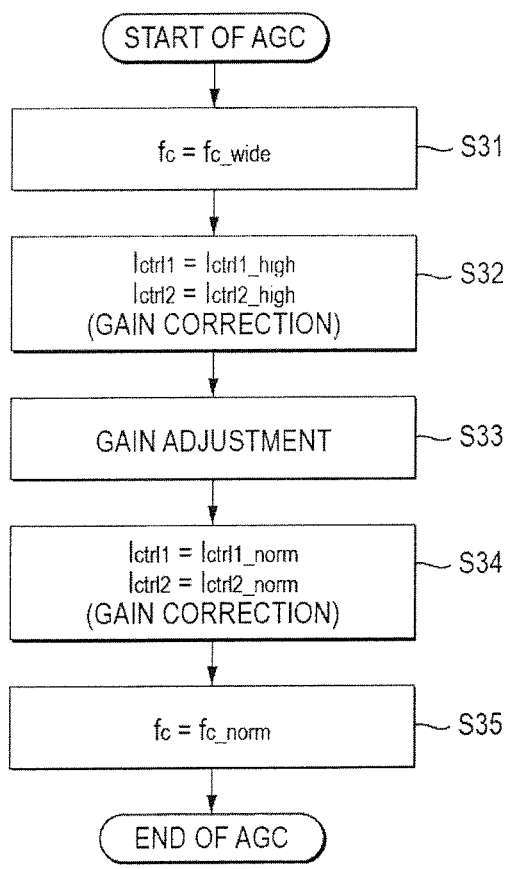
FIG. 12 is a flowchart showing how the reception circuit according to the third embodiment operates in an AGC period.

Next, how the reception circuit 100c according to the third embodiment operates in an AGC period will be described with reference to FIG. 12. FIG. 12 is a flowchart showing how the reception circuit 100c according to the third embodiment operates in an AGC period.

Referring to FIG. 12, upon a start of AGC, the AGC controller 9c outputs, to the VGAs 3 and 5, a gain code $D_{VGA}$ that specifies a known optimum gain of the VGAs 3 and 5.

The AGC controller 9c sets the cutoff frequency code for the HPFs 4 and 6 to a second cutoff frequency code $f_{c\_wide}$. That is, the AGC controller 9c sets the cutoff frequency $f_c$ of the HPFs 4 and 6 to a second cutoff frequency $f_{c\_wide}$ (S31).

After setting the cutoff frequency $f_c$ of the HPFs 4 and 6 to the second cutoff frequency $f_{c\_wide}$, the AGC controller 9c outputs, to the VGA current controller 14, a correction instruction to increase the gain of the VGAs 3 and 5 by a prescribed amount.

The VGA current controller 14 sets the bias currents $I_{ctrl1}$ and $I_{ctrl2}$ that determine gain correction amounts of the VGAs 3 and 5, respectively, to second bias currents $I_{ctrl1\_high}$ and $I_{ctrl2\_high}$ on the basis of the correction instruction that is output from the AGC controller 9c (S32). The VGA current controller 14 supplies the thus-set second bias currents $I_{ctrl1\_high}$ and $I_{ctrl2\_high}$ to the respective VGAs 3 and 5.

After the bias currents $I_{ctrl1}$ and $I_{ctrl2}$ have been set to the second bias currents $I_{ctrl1\_high}$ and $I_{ctrl2\_high}$, the gains of the VGAs 3 and 5 are adjusted by the AGC controller 9c and the VGA current controller (S33). How the gains of the VGAs 3 and 5 are adjusted will be described below.

The VGAs 3 and 5 receive the gain code $D_{VGA}$ from the AGC controller 9 and receive the second bias currents $I_{ctrl1\_high}$ and $I_{ctrl2\_high}$ from the VGA current controller 14. The VGAs 3 and 5 correct their gains on the basis of the received gain code $D_{VGA}$ and the second bias currents $I_{ctrl1\_high}$ and $I_{ctrl2\_high}$. The AGC controller 9c judges, through comparison, whether the digital value of a reception signal level that is output from the DSP 8 via the gains-corrected VGAs 3 and 5 is equal or approximately equal to an optimum reception signal level.

The gains of the VGAs 3 and 5 are adjusted repeatedly by the AGC controller 9c and the VGA current controller 14 until the digital value of the reception signal level becomes equal or approximately equal to the optimum reception signal level.

That is, when the cutoff frequency $f_c$ of the HPFs 4 and 6 has been set to the second cutoff frequency $f_{c\_wide}$ in the AGC period, the gains of the VGAs 3 and 5 are corrected on the basis of second bias currents $I_{ctrl1\_high}$ and $I_{ctrl2\_high}$ that are supplied from the VGA current controller 14. As a result, the gain of the VGAs 3 and 5 is increased by $G_{IUP}$ to $\{G(\mathbf{13})-G_{diff}+G_{IUP}\}$ and becomes equal or approximately equal to an optimum gain $G(\mathbf{13})$ (see FIG. 13).

If judging that the digital value of the reception signal level becomes equal or approximately equal to the optimum reception signal level, the AGC controller 9c judges that the adjustment of the gains of the VGAs 3 and 5 should be finished.

Upon completion of the adjustment of the gains of the VGAs 3 and 5 by the AGC, the AGC controller 9c outputs, to the VGA current controller 14, a correction finish instruction to finish the correction for increasing the gains of the VGAs 3 and 5 by prescribed amounts.

The VGA current controller 14 sets the bias currents $I_{ctrl1}$ and $I_{ctrl2}$ determining gain correction amounts of the VGAs 3 and 5 to the second bias currents and $I_{ctrl1\_norm}$ and $I_{ctrl2\_norm}$ (S34). The VGA current controller 14 supplies the thus-set second bias currents $I_{ctrl1\_norm}$ and $I_{ctrl2\_norm}$ to norm to the VGAs 3 and 5.

The AGC controller 9c sets the cutoff frequency code $f_{cc}$ for the HPFs 4 and 6 to a first cutoff frequency code $f_{cc\_norm}$. That is, the AGC controller 9c sets the cutoff frequency $f_c$ of the HPFs 4 and 6 to a first cutoff frequency $f_{c\_norm}$ (S35). The operation of the reception circuit 100c in the AGC period is thus finished.

With the above operation, the reception circuit 100c and the receiver 1000c according to the third embodiment can prevent the phenomenon that the error rate of a reception signal increases due to gain reduction of an amount $G_{diff}$ occurring in an AGC period and a signal reception period because of re-setting by AGC of the cutoff frequency $f_c$ of the HPFs 4 and 6 from a first cutoff frequency $f_{c\_norm}$ to a second cutoff frequency $f_{c\_wide}$.

Figure 13:
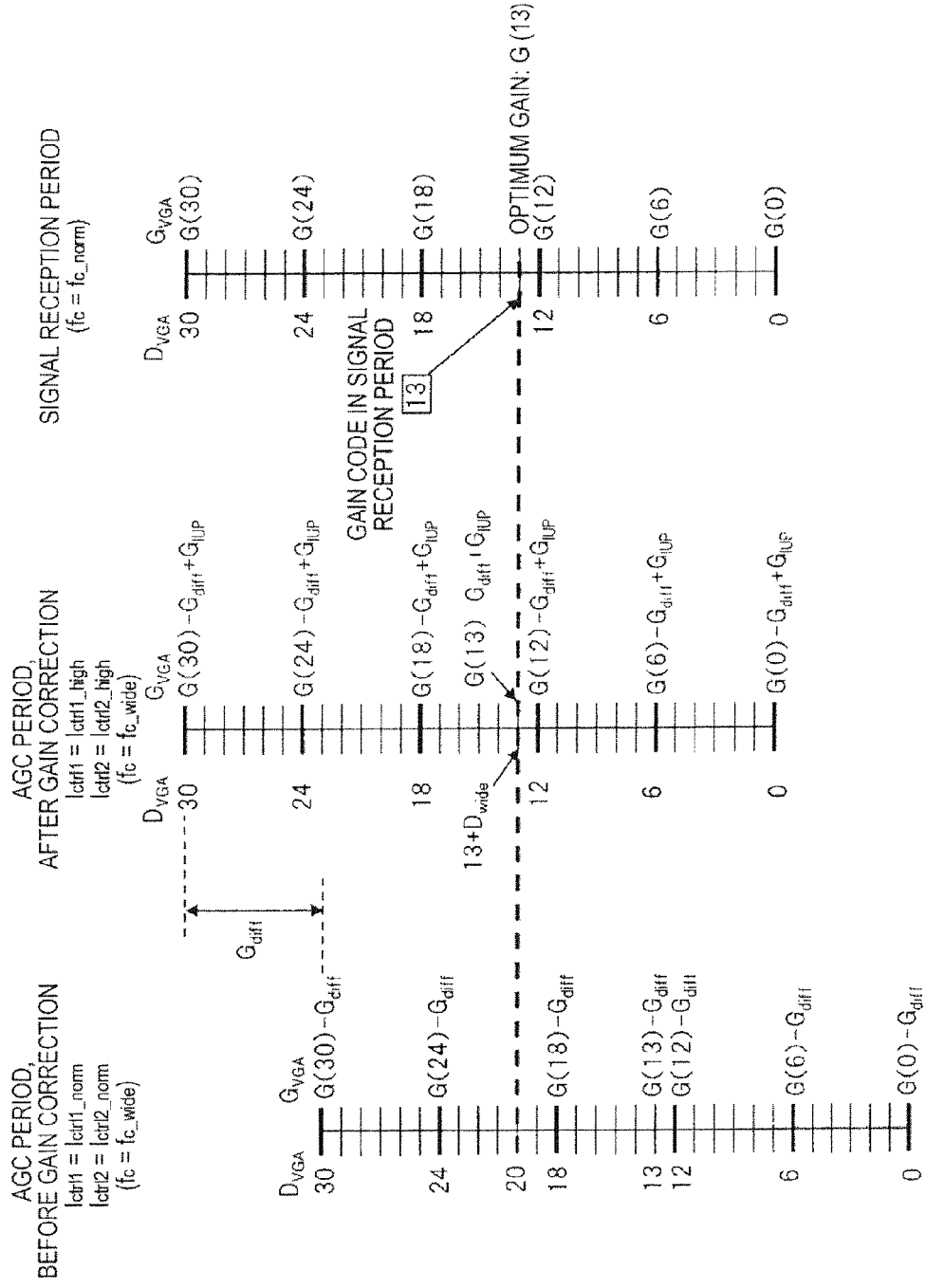
FIG. 13 illustrates advantages of the reception circuit and the receiver according to the third embodiment.

FIG. 13 illustrates advantages of the reception circuit 100C and the receiver 1000C according to the THIRD embodiment. The scale in the left part of FIG. 13 shows a corresponding relationship between the gain code $D_{VGA}$ and the gain $G_{VGA}$ of the VGAs 3 and 5 before a gain correction in an AGC period. The cutoff frequency $f_c$ is set to the second cutoff frequency $f_{c\_wide}$ and the bias currents $I_{ctrl1}$ and $I_{ctrl2}$ are set to the first bias currents $I_{ctrl1\_norm}$ and $I_{ctrl2\_norm}$.

The scale in the middle part of FIG. 13 a corresponding relationship between the gain code $D_{VGA}$ and the gain $G_{VGA}$ of the VGAs 3 and 5 after the gain correction in the AGC period. The cutoff frequency $f_c$, is set to the second cutoff frequency $f_{c\_wide}$ and the bias currents $I_{ctrl1}$ and $I_{ctrl2}$ are set to the second bias currents $I_{ctrl1\_high}$ and $I_{ctrl2\_high}$.

The scale in the right part of FIG. 13 shows a corresponding relationship between the gain code $D_{VGA}$ and the gain $G_{VGA}$ of the VGAs 3 and 5 in a signal reception period. The cutoff frequency $f_c$ is set to the first cutoff frequency $f_{c\_norm}$.

If the cutoff frequency $f_c$ of the HPFs 4 and 6 is at the second cutoff frequency $f_{c\_wide}$ and the bias currents $I_{ctrl1}$ and $I_{ctrl2}$ continue to be set at the first bias currents $I_{ctrl1\_norm}$ and $I_{ctrl2\_norm}$, the gain of the VGAs 3 and 5 decreases by a gain reduction amount $G_{diff}$.

Therefore, in the reception circuit 100c, in the AGC period, after the cutoff frequency $f_c$ of the HPFs 4 and 6 is set to the second cutoff frequency $f_{c\_wide}$, the VGA current controller 14 sets the bias currents $I_{ctrl1}$ and $I_{ctrl2}$ to the second bias currents $I_{ctrl1\_high}$ and $I_{ctrl2\_high}$ that are calculated according to Equations (9).

With the above measure, in the AGC period, the gain of the VGAs 3 and 5 is corrected and increased as a whole by an amount $G_{IUP}$ that corresponds to the bias currents $I_{ctrl1}$ and $I_{ctrl2}$ and a gain $\{G(13) - G_{diff} + G_{IUP}\}$ which is equal or approximately equal to the desired optimum gain $G(13)$ is set in the VGAs 3 and 5.

As a result, though the cutoff frequency $f_c$ reverts to the first cutoff frequency $f_{c\_norm}$ in the signal reception period, the desired optimum gain $G(13)$ can be set in the VGAs 3 and 5.

Therefore, in the reception circuit 100c and the receiver 1000c, the gain of the VGAs can be set to the optimum gain in an AGC period and hence increase of the error rate of a reception signal can be prevented in a signal reception period.

The reception circuit 100c and the receiver 1000c may be modified so that the DAC 13 shown in FIG. 8 is provided between the AGC controller 9c and the VGAs 3 and 5 and the gains of the VGAs 3 and 5 are adjusted by supplying analog control voltages $A_{AVG1}$ and $A_{AVG2}$ generated by the DAC 13 through DA conversion to the respective VGAs 3 and 5.

(Modification of Embodiment 3)

Figure 14:
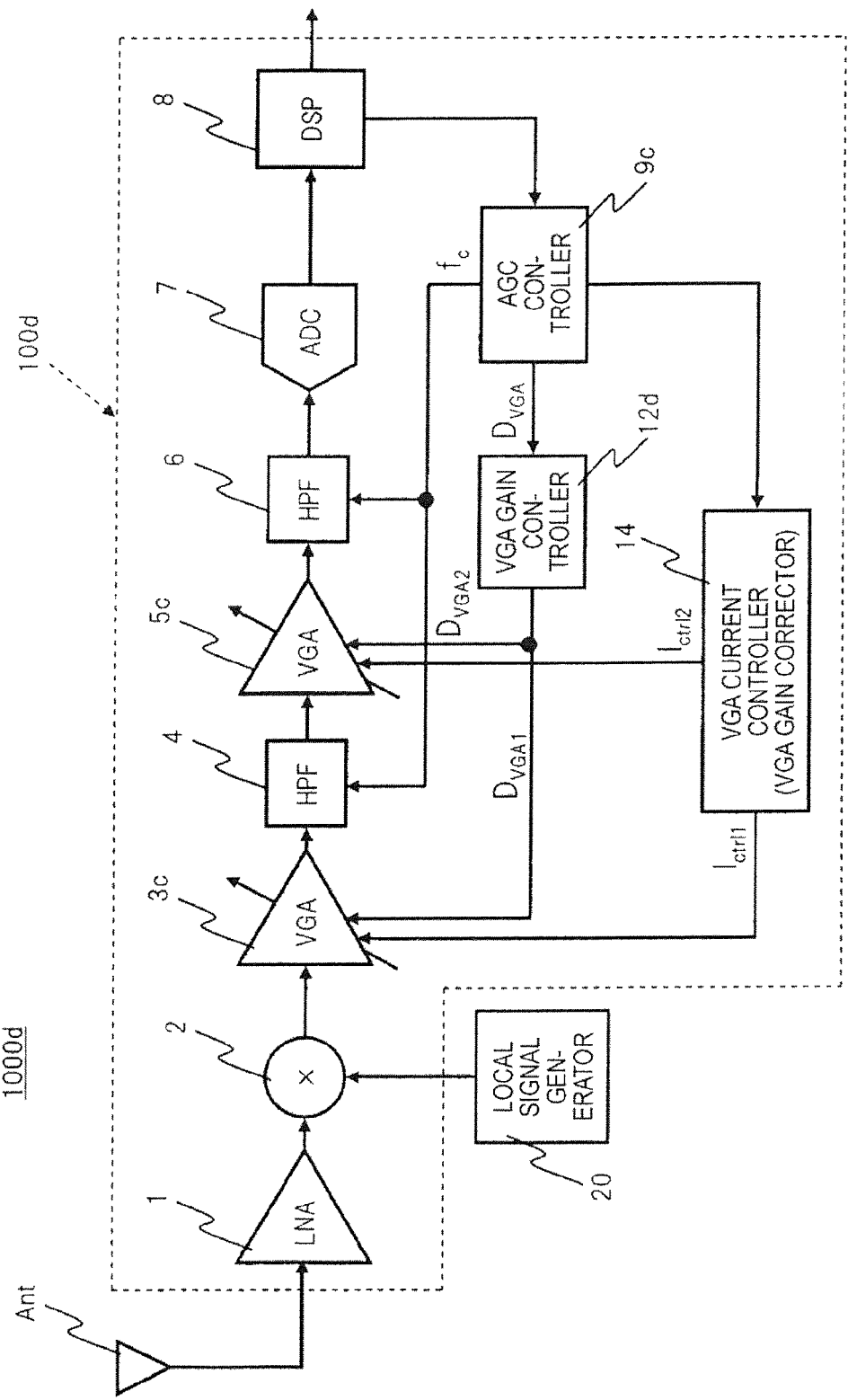
FIG. 14 is a block diagram showing the circuit configuration of a reception circuit and a receiver according to a modification of the third embodiment.

FIG. 14 is a block diagram showing the circuit configuration of a reception circuit 100d and a receiver 1000d according to a modification of the third embodiment. In the modification of the third embodiment, the reception circuit 100d and the receiver 1000d further include a VGA gain controller 12d for correcting VGA gains. Constituent elements having the same ones in the third embodiment will be given the same symbols as the latter and descriptions therefor will be omitted.

The VGA gain controller 12d receives a gain code $D_{VGA}$ that is output from the AGC controller 9c, and outputs the same or different gain codes $D_{VGA1}$ and $D_{VGA2}$ to the respective VGAs 3c and 5c on the basis of the received gain code $D_{VGA}$.

More specifically, the VGA gain controller 12d outputs the same or different gain codes $D_{VGA1}$ and $D_{VGA2}$ to the respective VGAs 3c and 5c on the basis of the received gain code $D_{VGA}$ by referring to an LUT (lookup table) shown in FIG. 7. A description of the LUT is omitted.

The VGA 3d corrects its gain on the basis of the gain code $D_{VGA1}$ that is output from the VGA gain controller 12d and the bias current $I_{ctrl1}$ that is supplied from the VGA current controller 14, and amplifies or attenuates the level of a reception signal that is output from the mixer 2, using the corrected gain. The VGA 3d outputs the level-amplified or attenuated reception signal to the HPF 4.

The VGA 5c corrects its gain on the basis of the gain code $D_{VGA2}$ that is output from the VGA gain controller 12d and the bias current $I_{ctrl2}$ that is supplied from the VGA current controller 14, and amplifies or attenuates the level of a reception signal that is output from the mixer 2, using the corrected gain. The VGA 5c outputs the level-amplified or attenuated reception signal to the HPF 6.

With the above-described configuration, the reception circuit 100d and the receiver 1000d according to the modification of the third embodiment can provide the same advantages as the reception circuit 100c and the receiver 1000c according to the third embodiment.

Embodiment 4

Because a reception circuit and a receiver according to a second embodiment are similar to the reception circuit 100 and the receiver 1000 according to the third embodiment, a block diagram showing their circuit configurations is omitted and they will be described using the same reference symbols as in the third embodiment. Constituent elements having the same ones in the third embodiment will be given the same symbols as the latter and descriptions therefor will be omitted.

In the fourth embodiment, the gain adjustment in AGC is divided into two stages, that is, a rough adjustment and a fine adjustment. In the rough adjustment, the cutoff frequency $f_c$ of the HPFs 4 and 6 is set to a second cutoff frequency $f_{c\_wide}$. In the fine adjustment, the cutoff frequency $f_c$ of the HPFs 4 and 6 is set to a first cutoff frequency $f_{c\_norm}$.

Figure 15:
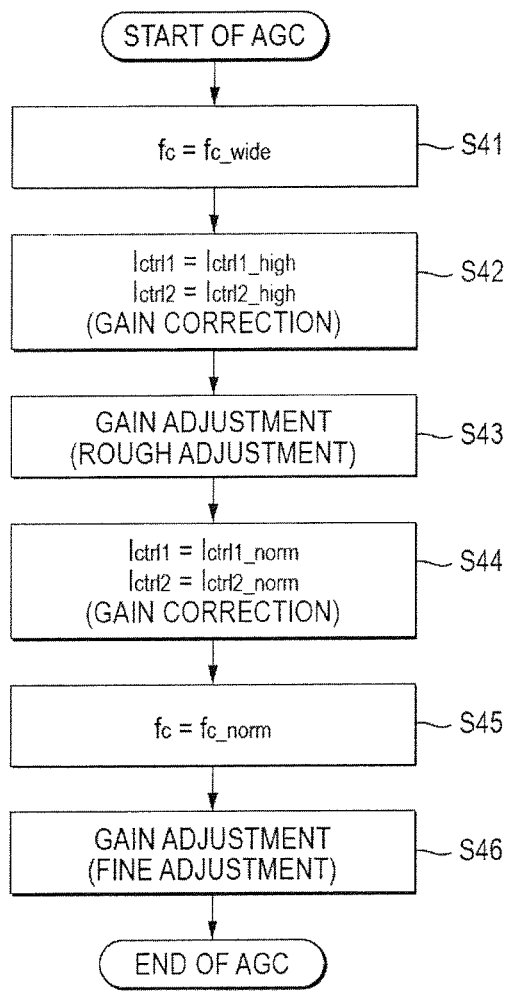
FIG. 15 is a flowchart showing how the reception circuit according to a fourth embodiment operates in an AGC period.

How the reception circuit 100c according to the fourth embodiment operates in an AGC period will be described with reference to FIG. 15. FIG. 15 is a flowchart showing how the reception circuit 100c according to the fourth embodiment operates in an AGC period. In this embodiment, an AGC period includes a rough adjustment period and a fine adjustment period.

Referring to FIG. 15, upon a start of an AGC rough adjustment, the AGC controller 9c outputs, to the VGAs 3 and 5, a gain code $D_{VGA}$ that specifies a known optimum gain of the VGAs 3 and 5.

The AGC controller 9e sets the cutoff frequency code $f_{cc}$ for the HPFs 4 and 6 to a second cutoff frequency code $f_{cc\_wide}$. That is, the AGC controller 9c sets the cutoff frequency $f_c$ of the HPFs 4 and 6 to a second cutoff frequency $f_{c\_wide}$ (S41).

After setting the cutoff frequency $f_c$ of the HPFs 4 and 6 to the second cutoff frequency $f_{c\_wide}$, the AGC controller 9c outputs, to the VGA current controller 14, a rough correction instruction to increase the gain of the VGAs 3 and 5 by a prescribed amount.

The VGA current controller 14 sets the bias currents $I_{ctrl1}$ and $I_{ctrl2}$ that determine gain correction amounts the VGAs 3 and 5 to second bias currents $I_{ctrl1\_high}$ and $I_{ctrl2\_high}$ calculated according to Equations (9) on the basis of the rough correction instruction that is output from the AGC controller 9 (S42). The VGA current controller 14 supplies the thus-set second bias currents $I_{ctrl1\_high}$ and $I_{ctrl2\_high}$ to the VGAs 3 and 5.

After the bias currents $I_{ctrl1}$ and $I_{ctrl2}$ have been set to the second bias currents $I_{ctrl1\_high}$ and $I_{ctrl2\_high}$, the gain of the VGAs 3 and 5 is adjusted roughly by the AGC controller 9c and the VGA current controller 14 (S43). How the gain of the VGAs 3 and 5 is adjusted roughly will be described below.

Based on the above description, it is assumed that in the AGC rough adjustment period the convergence range of the gain code $D_{VGA}$ is a six-code range. Therefore, the gain code $D_{VGA}$ that has been converged in the rough adjustment period shown in FIG. 16 as a result of the AGC rough adjustment is judged within, for example, a range of 6 to 12 or 12 to 18.

The VGAs 3 and 5 receives the gain code $D_{VGA}$ that is output from the AGC controller 9 and the first bias currents second bias currents $I_{ctrl1\_high}$ and $I_{ctrl2\_high}$ that are output from the VGA current controller 14. The VGAs 3 and 5 correct their gains on the basis of the received gain code $D_{VGA}$ and the second bias currents $I_{ctrl1\_high}$ and $I_{ctrl2\_high}$ calculated according to Equations (9). The DSP 8 outputs the digital value of a reception signal level. The AGC controller 9c judges, through comparison, whether the digital value of the reception signal level that is output from the DSP 8 via the gains-corrected VGAs 3 and 5 is equal or approximately equal to a desired optimum reception signal level.

The rough adjustment of the gains of the VGAs 3 and 5 is performed repeatedly by the AGC controller 9c and the VGA current controller 14 until the digital value of the reception signal level becomes equal or approximately equal to the optimum reception signal level.

That is, when the cutoff frequency $f_c$ of the HPFs 4 and 6 has been set to the second cutoff frequency $f_{c\_wide}$ in the AGC rough adjustment period, the gains of the VGAs 3 and 5 are corrected on the basis of a gain code $D_{VGA}$ that is output from the AGC controller 9c and second bias currents $I_{ctrl1\_high}$ and $I_{ctrl2\_high}$ that are supplied from the VGA current controller 14.

As a result, the gain of the VGAs 3 and 5 is increased by $G_{IUP}$. It is judged that the gain of the VGAs 3 and 5 becomes equal or approximately equal to an optimum gain G(13) as a result of the AGC rough adjustment in the case where the gain code is in the range of 12 to 18, that is, the gain is in a range of $\{G(12)-G_{diff}+G_{IUP}\}$ to $\{G(18)-G_{diff}+G_{sIUP}\}$ (see FIG. 16).

If judging that the digital value of the reception signal level becomes equal or approximately equal to the optimum reception signal level, the AGC controller 9c judges that the rough adjustment of the gains of the VGAs 3 and 5 should be finished. That is, as a result of the AGC rough adjustment the AGC controller 9c judges that the convergence range of the gain code $D_{VGA}$ that determines the gain of the VGAs 3 and 5 is 12 to 18.

Upon completion of the AGC rough adjustment of the gains of the VGAs 3 and 5, the AGC controller 9c outputs, to the VGA current controller 14, a rough adjustment finish instruction to finish the correction for increasing the gain of the VGAs 3 and 5 by a prescribed amount.

The VGA current controller 14 sets the bias currents $I_{ctrl1}$ and $I_{ctrl2}$ that determine gain correction amounts of the VGAs 3 and 5 to the first bias currents $I_{ctrl1\_norm}$ and $I_{ctrl2\_norm}$ (S44). The VGA current controller 14 supplies the thus-set first bias currents $I_{ctrl1\_norm}$ and $I_{ctrl2\_norm}$ to the VGAs 3 and 5.

The AGC controller 9c sets the cutoff frequency code $f_c$ for the HPFs 4 and 6 to a first cutoff frequency code $f_{c\_norm}$. That is, the AGC controller 9c sets the cutoff frequency $f_c$ of the HPFs 4 and 6 to a first cutoff frequency $f_{c\_norm}$ (S45).

After the cutoff frequency $f_c$ of the HPFs 4 and 6 has been set to the first cutoff frequency code $f_{c\_norm}$, the AGC controller 9c adjusts the gains of the VGAs 3 and 5 finely (S46). How the gains of the VGAs 3 and 5 are adjusted finely will be described below.

Based on the above description, it is assumed that in an AGC fine adjustment period the convergence range of the gain code $D_{VGA}$ is a one-code range. Therefore, the gain code $D_{VGA}$ that has been converged in the fine adjustment period shown in FIG. 16 as a result of the AGC fine adjustment is judged to be, for example, 12 or 13.

For example, the AGC controller 9c judges that the gain code specifying a gain of the VGAs 3 and 5 at the start of the AGC fine adjustment is the middle point ($D_{VGA}=15$) of the gain code range (12 to 18) which is the judgment result of the AGC rough adjustment.

The AGC controller 9c outputs the determined gain code $D_{VGA}$ to each of the VGSs 3 and 5. The AGC controller 9 judges, through comparison, whether the digital value of a reception signal level that is output from the DSP 8 via the VGAs 3 and 5 whose gain has been corrected on the basis of the gain code $D_{VGA}$ that is output from the AGC controller 9c is equal to an optimum reception signal level.

The gain of the VGAs 3 and 5 is adjusted repeatedly by the AGC controller 9 until the digital value of the reception signal level becomes equal to the optimum reception signal level.

That is, when the cutoff frequency $f_c$ of the HPFs 4 and 6 has been set to the first cutoff frequency $f_{c\_norm}$ in the AGC fine adjustment period, the gain of the VGAs 3 and 5 is adjusted on the basis of a gain code $D_{VGA}$ that is output from the AGC controller 9c. As a result, the gain of the VGAs 3 and 5 becomes equal to the optimum gain G(13) as a result of the AGC fine adjustment (see FIG. 16).

If judging that the digital value of the reception signal level becomes equal to the optimum reception signal level, the AGC controller 9c judges that the fine adjustment of the gain of the VGAs 3 and 5 should be finished. That is, as a result of the AGC fine adjustment, the AGC controller 9c judges that the gain code $D_{VGA}$ specifying the gain of the VGAs 3 and 5 should be equal to "13." The operation of the reception circuit 100 in the AGC period is thus finished.

With the above operation, the reception circuit 100c and the receiver 1000c according to the fourth embodiment provides, in addition to the advantages of the reception circuit 100c and the receiver 1000c according to the third embodiment, an advantage that AGC can be performed with high accuracy because of the two-stage AGC that consists of rough adjustment and fine adjustment.

Figure 16:
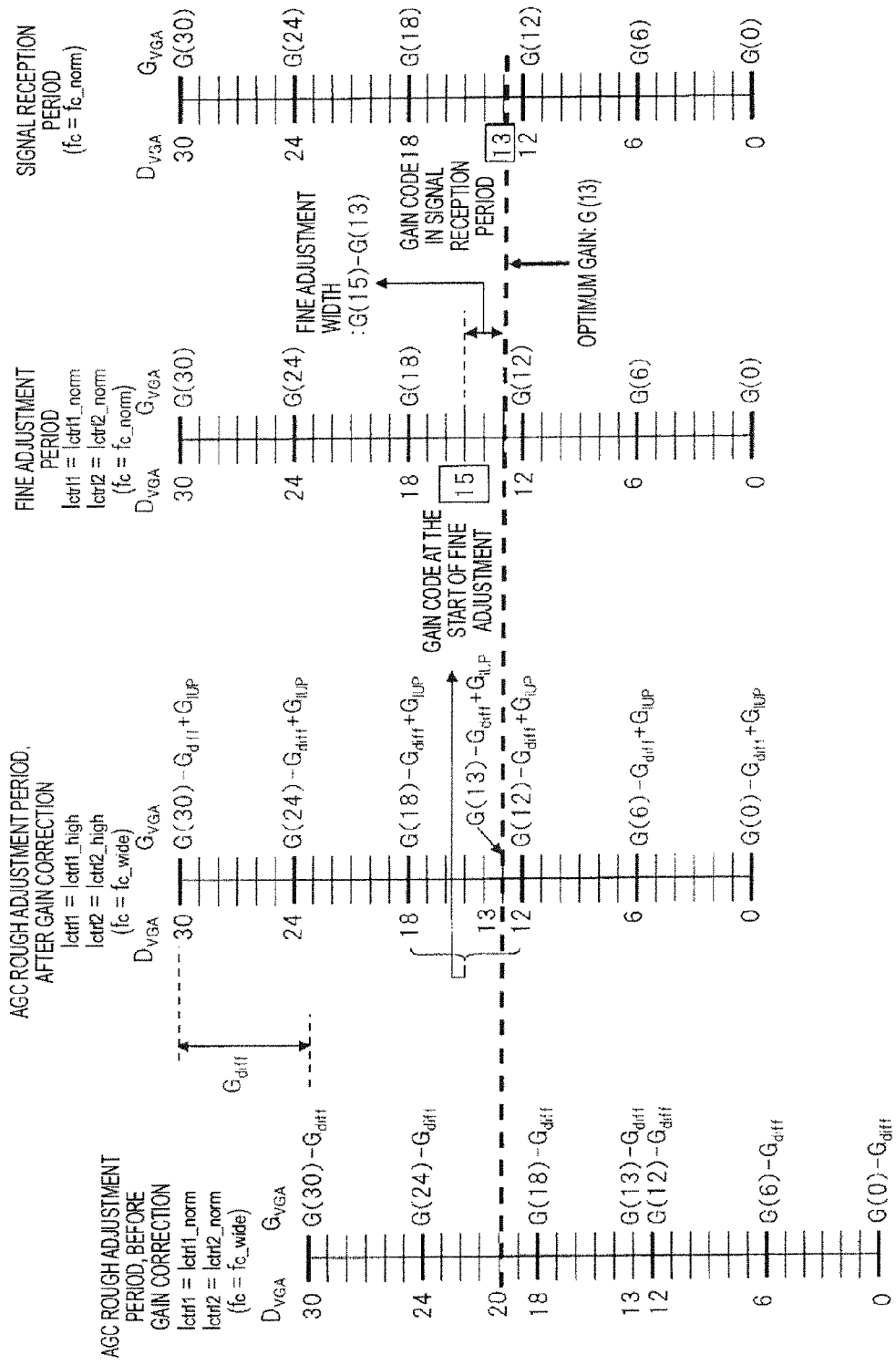
FIG. 16 illustrates advantages of the reception circuit and the receiver according to the fourth embodiment.

FIG. 16 illustrates advantages of the reception circuit 100c and the receiver 1000c according to the fourth embodiment. The scale in the leftmost part of FIG. 16 shows a corresponding relationship between the gain code $D_{VGA}$ and the gain $G_{VGA}$ of the VGAs 3 and 5 before a gain correction to be performed in a rough adjustment period of an AGC period. The cutoff frequency $f_c$ is set to the second cutoff frequency $f_{c\_wide}$ and the bias currents $I_{ctrl1}$ and $I_{ctrl2}$ are set to the second bias currents $I_{ctrl1\_norm}$ and $I_{ctrl2\_norm}$.

The scale in the second left part of FIG. 16 shows a corresponding relationship between the gain code $D_{VGA}$ and the gain $G_{VGA}$ of the VGAs 3 and 5 after the gain correction performed in the AGC rough adjustment period. The cutoff frequency $f_c$ is set to the second cutoff frequency and the bias currents $I_{ctrl1}$ and $I_{ctrl2}$ are set to the second bias currents $I_{ctrl1\_high}$ and $I_{ctrl2\_high}$.

The scale in the second right part of FIG. 16 shows a corresponding relationship between the gain code $D_{VGA}$ and the gain $G_{VGA}$ of the VGAs 3 and 5 in an AGC fine adjustment period. The cutoff frequency $f_c$ is set to the first cutoff frequency $f_{c\_norm}$ and the bias currents $I_{ctrl1}$ and $I_{ctrl2}$ are set to the first bias currents $I_{ctrl1\_norm}$ and $I_{ctrl2\_norm}$.

The scale in the rightmost part of FIG. 16 shows a corresponding relationship between the gain code $D_{VGA}$ and the gain $G_{VGA}$ of the VGAs 3 and 5 in a signal reception period. The cutoff frequency $f_c$ is set to the first cutoff frequency $f_{c\_norm}$.

If the cutoff frequency $f_c$ of the HPFs 4 and 6 is at the second cutoff frequency $f_{c\_wide}$ and the bias currents $I_{ctrl1}$ and $I_{ctrl2}$ continue to be set at the first bias currents $I_{ctrl1\_norm}$ and $I_{ctrl2\_norm}$, the gain of the VGAs 3 and 5 decreases by a gain reduction amount $G_{diff}$.

Therefore, in the reception circuit 100c, in the AGC rough adjustment period, after the cutoff frequency $f_c$ of the HPFs 4 and 6 is set to the second cutoff frequency $f_{c\_wide}$, the VGA current controller 14 sets the bias currents $I_{ctrl1}$ and $I_{ctrl2}$ to the second bias currents $I_{ctrl1\_high}$ and $I_{ctrl2\_high}$.

With the above measure, in the AGC rough adjustment period, the gain of the VGAs 3 and 5 is corrected and increased as a whole by an amount $G_{IUP}$ that corresponds to the second bias currents $I_{ctrl1\_high}$ and $I_{ctrl2\_high}$. Therefore, it is judged that the gain $G_{VGA}$ of the VGAs 3 and 5 becomes equal or approximately equal to their optimum gain G(13) as a result of the AGC rough adjustment in the case where the gain code is in the range of 12 to 18, that is, the gain $G_{VGA}$ is in a range of $\{G(12)-G_{diff}+G_{IUP}\}$ to $\{G(18)-G_{diff}+G_{IUP}\}$.

Subsequently, in the reception circuit 100c, in the AGC fine adjustment period, after the cutoff frequency $f_c$ of the HPFs 4 and 6 is set to the first cutoff frequency $f_{c\_norm}$, the VGA current controller 14 sets the bias currents $I_{ctrl1}$ and $I_{ctrl2}$ to the first bias currents $I_{ctrl1\_norm}$ and $I_{ctrl2\_norm}$.

With these settings, in the AGC fine adjustment period, the difference from the optimum gain G(13) of the VGAs 3 and 5 is adjusted finely in a width of G(15)−G(13) in such a manner that the middle point ($D_{VGA}$=15) of the gain code range 12 to 18 determined as a result of the AGC rough adjustment serves as a starting point. After the AGC fine adjustment, the optimum gain G(13) of the VGAs 3 and 5 is set in the VGAs 3 and 5.

In the subsequent signal reception period, since the cutoff frequency $f_c$ is already returned to the first cutoff frequency $f_{c\_norm}$, the optimum gain G(13) can be set in the VGAs 3 and 5.

Therefore, in the reception circuit 100c and the receiver 1000c, in a fine adjustment period, the error from an optimum gain can be made small in a fine adjustment period by performing a gain adjustment on the basis of a result of a rough adjustment, whereby the fine adjustment period can be shortened. Furthermore, also in a signal reception period, error rate increase can be prevented because AGC has been performed with a gain reduction amount $G_{diff}$ taken into consideration.

Although the various embodiments have been described above with reference to the drawings, it goes without saying that the disclosure is not limited to those examples. It is apparent that those skilled in the art would conceive various changes or modifications within the confines of the claims. And such changes or modifications should naturally be construed as being included in the technical scope of the disclosure.

Although in each of the above embodiments the AGC controller outputs the same cutoff frequency code to the HPFs 4 and 6 of the reception circuit and the receiver, it may output different cutoff frequency codes. In this case, the cutoff frequencies of the HPFs 4 and 6 are made different from each other.

Although in the configurations of the reception circuit and the receiver according to each of the above embodiments the two VGAs and the two HPFs are arranged alternately, the numbers of VGAs and HPFs and their arrangement locations are not limited to those of the configurations according to the above embodiments. Where an HPF is disposed upstream of a VGA, it is preferable that a gain code D be calculated on the basis of a circuit configuration including the mixer 2.

The present application is based on Japanese Patent Application No. 2011-209655 filed on Sep. 26, 2011, the disclosure of which is incorporated herein by reference.

INDUSTRIAL APPLICABILITY

This disclosure is useful when applied to reception circuits and receivers which prevent increase of the error rate of a reception signal in a signal reception period by correcting for a gain reduction amount of a VGA that occurs because of setting of a cutoff frequency of an HPF in an AGC period and thereby setting an optimum gain in the VGA.

DESCRIPTION OF SYMBOLS

1: LNA
2: Mixer
3, 3b, 3c, 5, 5b, 5c: VGA
4, 6: HPF
7: ADC
8: DSP
9, 9c: AGC controller
10: VGA gain corrector
11: Adder
12, 12d: VGA gain controller
13: DAC
14: VGA current controller
20: Local signal generator
100, 100a, 100b, 100c, 100d: Reception circuit
1000, 1000a, 1000b, 1000c, 1000d: Receiver

The invention claimed is:

1. A reception circuit comprising:
a mixer configured to frequency-convert a wideband high-frequency reception signal and output a baseband reception signal;
at least one VGA configured to amplify the baseband reception signal using a prescribed gain;
at least one HPF configured to stop part, in a band that is lower than a first cutoff frequency, of the amplified reception signal;
an ADC configured to AD-convert an output signal of the at least one HPF and output a digital reception signal;
a processor configured to demodulate the output signal of the ADC;
an AGC controller configured to output, in an AGC period, a gain code corresponding to the prescribed gain to be set in the VGA; and
a VGA gain corrector configured to correct the prescribed gain by a prescribed amount,
wherein the AGC controller sets a cutoff frequency of the at least one HPF to a second cutoff frequency that is higher than the first cutoff frequency at a start of the AGC period, and sets the cutoff frequency of the at least one HPF to the first cutoff frequency before an end of the AGC period; and
wherein the VGA gain corrector sets a correction amount of the prescribed gain to a first correction amount after the setting of the cutoff frequency of the at least one HPF to the second cutoff frequency, and sets the correction amount of the prescribed gain to a second correction amount that is smaller than the first correction amount after the setting of the cutoff frequency of the at least one HPF to the first cutoff frequency,
wherein a difference between the first correction amount and the second correction amount is equal to a gain reduction amount of the wideband gain that occurs because of the setting of the cutoff frequency of the at least one HPF to the second cutoff frequency.

2. The reception circuit according to claim 1, wherein the VGA gain corrector calculates a gain correction code specifying the correction amount of the prescribed gain on the basis of a correction instruction received from the AGC controller; and the reception circuit further comprising:
an adder configured to add together the gain correction code calculated by the VGA gain corrector and the gain code that is output from the AGC controller, and output an addition value to the at least one VGA.

3. The reception circuit according to claim 2, wherein the VGA gain corrector sets the gain correction code to a first gain correction code specifying the first correction amount after the setting of the cutoff frequency of the at least one HPF to the second cutoff frequency, and sets the gain correction code to a second gain correction code specifying the second correction amount after the setting of the cutoff frequency of the at least one HPF to the first cutoff frequency.

4. A reception circuit comprising:
a mixer configured to frequency-convert a wideband high-frequency reception signal and output a baseband reception signal;
at least one VGA configured to amplify the baseband reception signal using a prescribed gain;
at least one HPF configured to stop part, in a band that is lower than a first cutoff frequency, of the amplified reception signal;
an ADC configured to AD-convert an output signal of the at least one HPF and output a digital reception signal;
a processor configured to demodulate the output signal of the ADC;
an AGC controller configured to output, in an AGC period, a gain code corresponding to the prescribed gain to be set in the VGA; and
a VGA gain corrector configured to correct the prescribed gain by a prescribed amount,
wherein the AGC controller sets a cutoff frequency of the at least one HPF to a second cutoff frequency that is higher than the first cutoff frequency at a start of the AGC period, and sets the cutoff frequency of the at least one HPF to the first cutoff frequency before an end of the AGC period; and
wherein the VGA gain corrector sets a correction amount of the prescribed gain to a first correction amount after the setting of the cutoff frequency of the at least one HPF to the second cutoff frequency, and sets the correction amount of the prescribed gain to a second correction amount that is smaller than the first correction amount after the setting of the cutoff frequency of the at least one HPF to the first cutoff frequency,
wherein the VGA gain corrector calculates a gain correction code specifying the correction amount of the prescribed gain on the basis of a correction instruction received from the AGC controller; and
the reception circuit further comprising:
an adder configured to add together the gain correction code calculated by the VGA gain corrector and the gain code that is output from the AGC controller, and output an addition value to the at least one VGA,
wherein the VGA gain corrector sets the gain correction code to a first gain correction code specifying the first correction amount after the setting of the cutoff frequency of the at least one HPF to the second cutoff frequency, and sets the gain correction code to a second gain correction code specifying the second correction amount after the setting of the cutoff frequency of the at least one HPF to the first cutoff frequency, wherein the VGA gain corrector calculates, as a difference between the first gain correction code and the second gain correction code, a value obtained by rounding off to the nearest integer a value obtained by dividing a gain reduction amount of the gain that occurs because of the setting of the cutoff frequency of the at least one HPF to the second cutoff frequency by an average of variation amounts of the prescribed gain per gain correction code.

5. The reception circuit according to claim 3 further comprising:
a VGA gain controller configured to output the same or different gain codes to the respective VGAs on the basis of the addition value, output from the adder, of the gain correction code and the gain code.

6. The reception circuit according to claim 1, wherein the VGA gain corrector supplies a bias current to the at least one VGA on the basis of a correction instruction received from the AGC controller; and
wherein the VGA gain corrector sets the bias current to a second bias current after the setting of the cutoff frequency of the at least one HPF to the second cutoff frequency, and sets the bias current to a first bias current after the setting of the cutoff frequency of the at least one HPF to the first cutoff frequency.

7. A reception circuit comprising:
a mixer configured to frequency-convert a wideband high-frequency reception signal and output a baseband reception signal;
at least one VGA configured to amplify the baseband reception signal using a prescribed gain;
at least one HPF configured to stop part, in a band that is lower than a first cutoff frequency, of the amplified reception signal;
an ADC configured to AD-convert an output signal of the at least one HPF and output a digital reception signal;
a processor configured to demodulate the output signal of the ADC;
an AGC controller configured to output, in an AGC period, a gain code corresponding to the prescribed gain to be set in the VGA; and
a VGA gain corrector configured to correct the prescribed gain by a prescribed amount,
wherein the AGC controller sets a cutoff frequency of the at least one HPF to a second cutoff frequency that is higher than the first cutoff frequency at a start of the AGC period, and sets the cutoff frequency of the at least one HPF to the first cutoff frequency before an end of the AGC period; and
wherein the VGA gain corrector sets a correction amount of the prescribed gain to a first correction amount after the setting of the cutoff frequency of the at least one HPF to the second cutoff frequency, and sets the correction amount of the prescribed gain to a second correction amount that is smaller than the first correction amount after the setting of the cutoff frequency of the at least one HPF to the first cutoff frequency,
wherein the VGA gain corrector supplies a bias current to the at least one VGA on the basis of a correction instruction received from the AGC controller; and
wherein the VGA gain corrector sets the bias current to a second bias current after the setting of the cutoff frequency of the at least one HPF to the second cutoff frequency, and sets the bias current to a first bias current after the setting of the cutoff frequency of the at least one HPF to the first cutoff frequency, wherein a gain of the at least one VGA that is obtained when it is supplied with the second bias current in the AGC period is equal to a gain of the at least one VGA that is obtained when it is supplied with the first bias current in a reception period of the reception signal.

8. A receiver comprising:

the reception circuit according to claim 1;

a reception antenna configured to receive the wideband high-frequency reception signal; and a local signal generator configured to generate a local signal in a prescribed frequency band and output the local signal to the mixer.

9. The reception circuit according to claim 3, wherein the VGA gain corrector further includes a VGA gain controller configured to output the same or different gain codes to the at least one VGA on the basis of the addition value, output from the adder, of the gain correction code and the gain code or the gain code that is output from the AGC controller.

\* \* \* \* \*